(12) United States Patent
Chan et al.

(10) Patent No.: US 9,437,488 B2
(45) Date of Patent: Sep. 6, 2016

(54) METALLIZATION METHOD FOR SEMICONDUCTOR STRUCTURES

(71) Applicant: IMEC VZW, Leuven (BE)

(72) Inventors: Boon Teik Chan, Leuven (BE); Silvia Armini, Leuven (BE); Frederic Lazzarino, Leuven (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 14/939,286

(22) Filed: Nov. 12, 2015

(65) Prior Publication Data
US 2016/0155664 A1 Jun. 2, 2016

(30) Foreign Application Priority Data

Dec. 1, 2014 (EP) .................................. 14195695

(51) Int. Cl.
| | | |
|---|---|---|
| *H01L 21/4763* | (2006.01) | |
| *H01L 21/768* | (2006.01) | |
| *H01L 21/311* | (2006.01) | |
| *H01L 21/321* | (2006.01) | |
| *H01L 21/3105* | (2006.01) | |
| *H01L 23/532* | (2006.01) | |

(52) U.S. Cl.
CPC ... *H01L 21/76877* (2013.01); *H01L 21/31053* (2013.01); *H01L 21/31144* (2013.01); *H01L 21/3212* (2013.01); *H01L 21/7684* (2013.01); *H01L 21/76808* (2013.01); *H01L 21/76814* (2013.01); *H01L 21/76816* (2013.01); *H01L 21/76831* (2013.01); *H01L 21/76832* (2013.01); *H01L 21/76843* (2013.01); *H01L 21/76871* (2013.01); *H01L 21/76885* (2013.01); *H01L 23/53238* (2013.01); *H01L 21/7682* (2013.01); *H01L 2221/1026* (2013.01); *H01L 2221/1063* (2013.01)

(58) Field of Classification Search
CPC .................. H01L 21/76877; H01L 21/76832; H01L 21/31144; H01L 23/53238
USPC ......................................................... 438/643
See application file for complete search history.

(56) References Cited

U.S. PATENT DOCUMENTS

| | | | |
|---|---|---|---|
| 8,088,687 B2 | 1/2012 | Yeom et al. | |
| 8,652,962 B2 | 2/2014 | Singh et al. | |
| 2008/0251919 A1 | 10/2008 | Shih et al. | |
| 2011/0057316 A1 | 3/2011 | Kim et al. | |
| 2012/0252206 A1 | 10/2012 | Naik et al. | |
| 2014/0252620 A1* | 9/2014 | Huang | H01L 23/53238 257/751 |
| 2014/0273434 A1 | 9/2014 | Peng et al. | |

* cited by examiner

*Primary Examiner* — David S Blum
(74) *Attorney, Agent, or Firm* — McDonnell Boehnen Hulbert & Berghoff LLP

(57) ABSTRACT

A method is provided for fabricating a semiconductor device that includes providing a structure with a sacrificial layer having at least one through-hole exposing a metal surface and, optionally, an oxide surface. In one example, the method may include applying a self-assembled monolayer selectively on the exposed metal surface and/or on the oxide surface. The method may also include growing a metal on the self-assembled monolayer and on the exposed metal surface if no self-assembled monolayer is present thereon, so as to fill the at least one through-hole, thereby forming at least one metal structure. The method may further include replacing the first sacrificial layer by a replacement dielectric layer having a dielectric constant of at most 3.9.

15 Claims, 15 Drawing Sheets

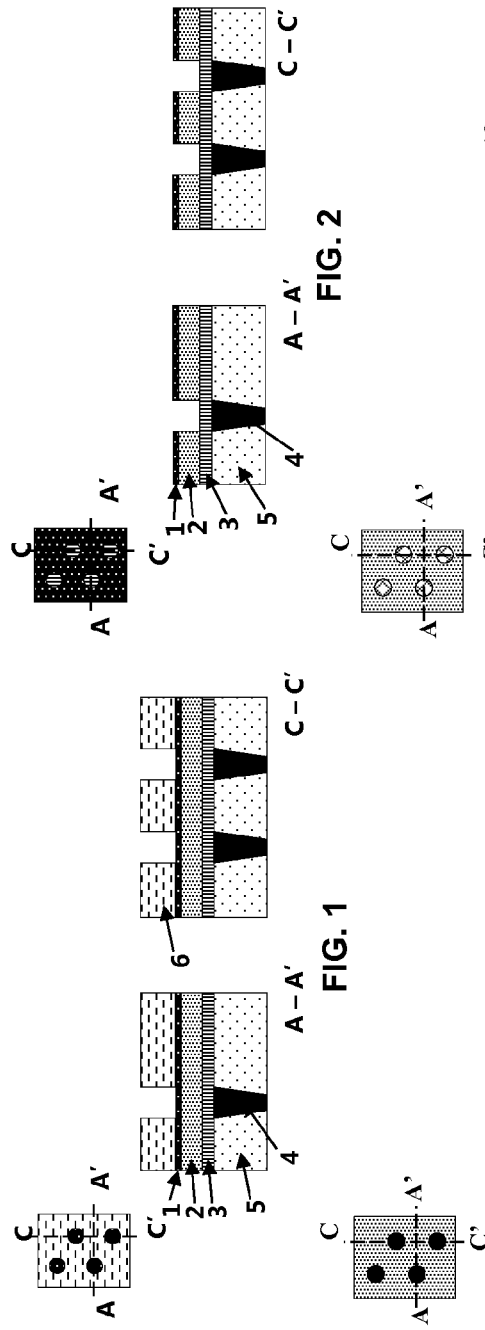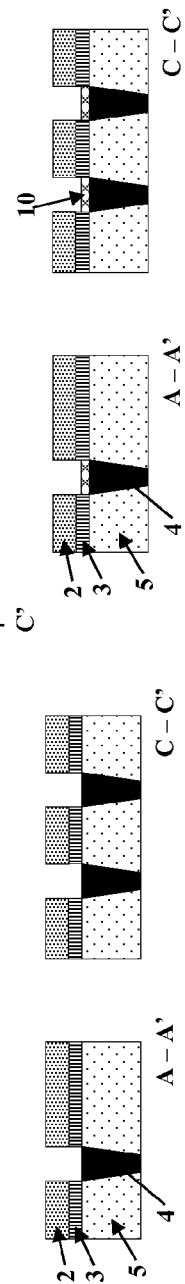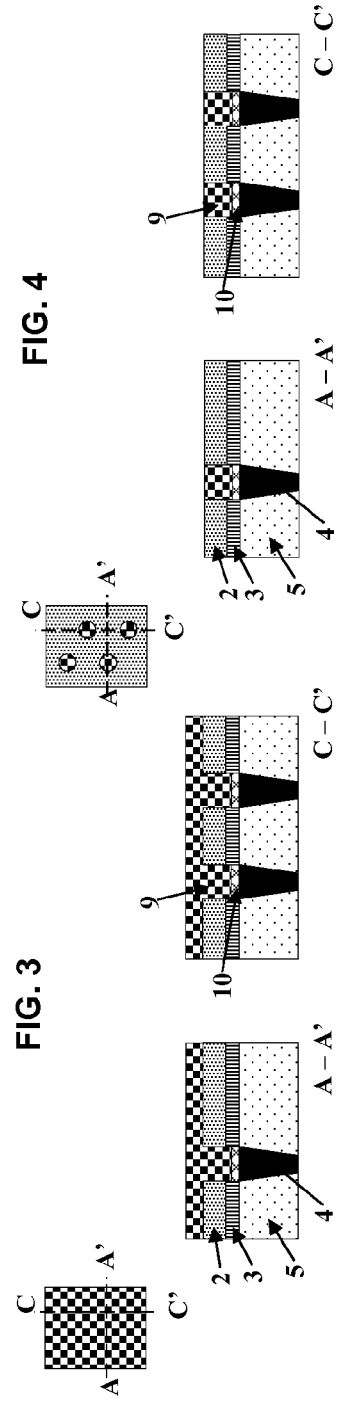

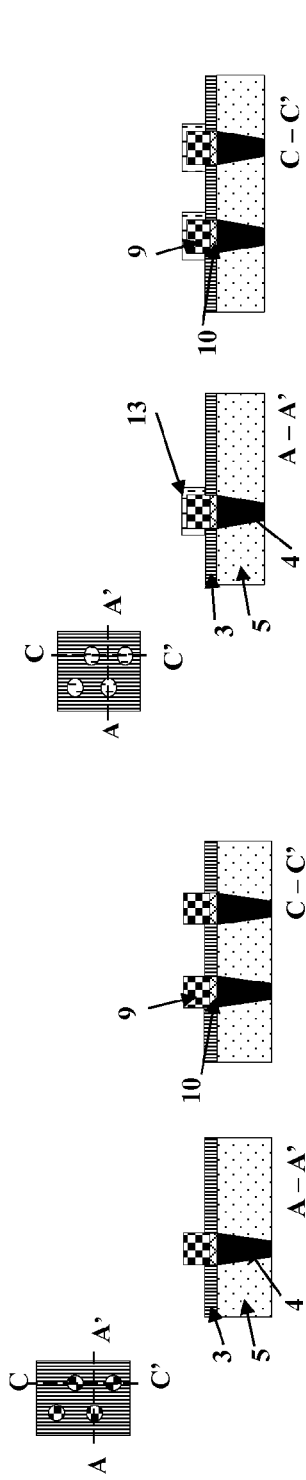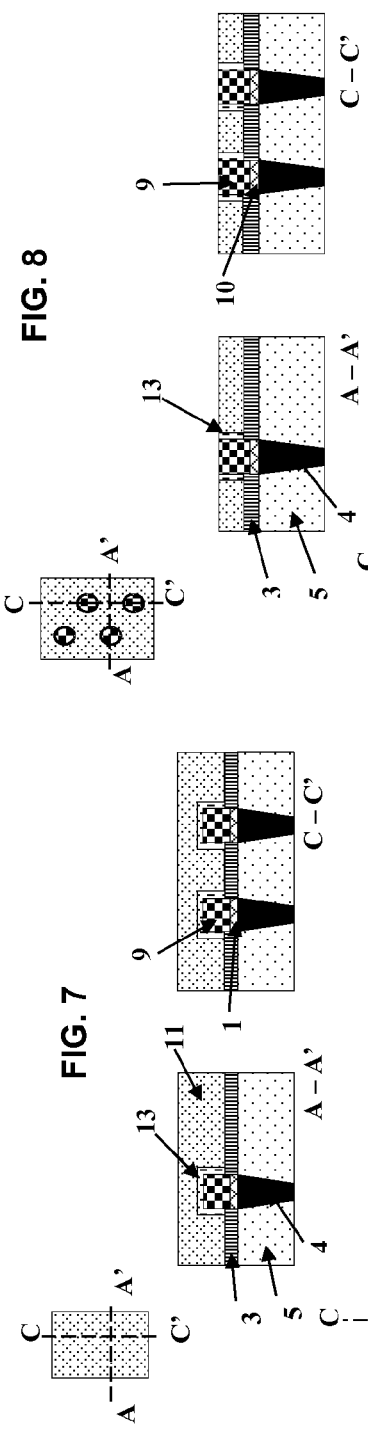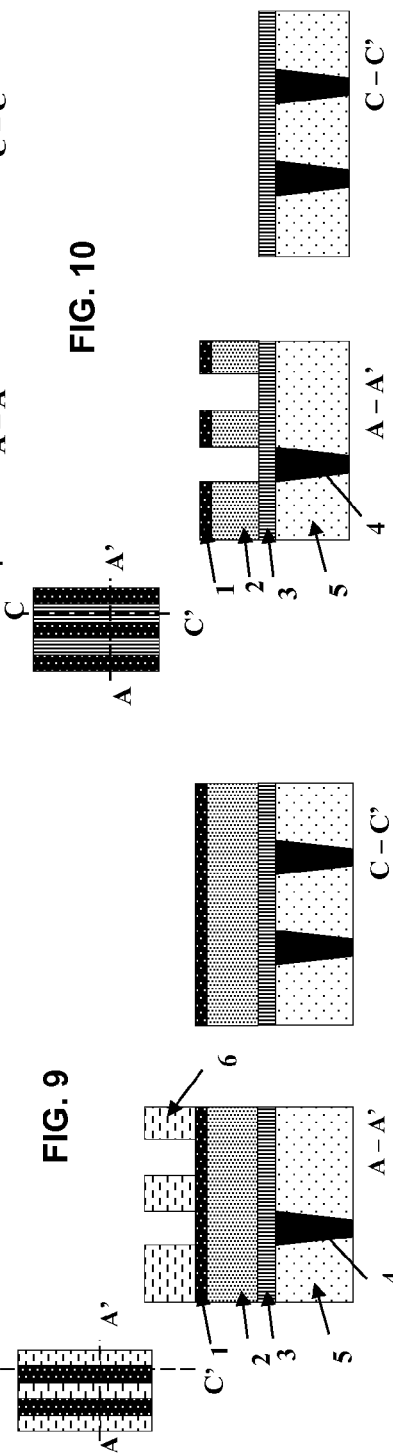

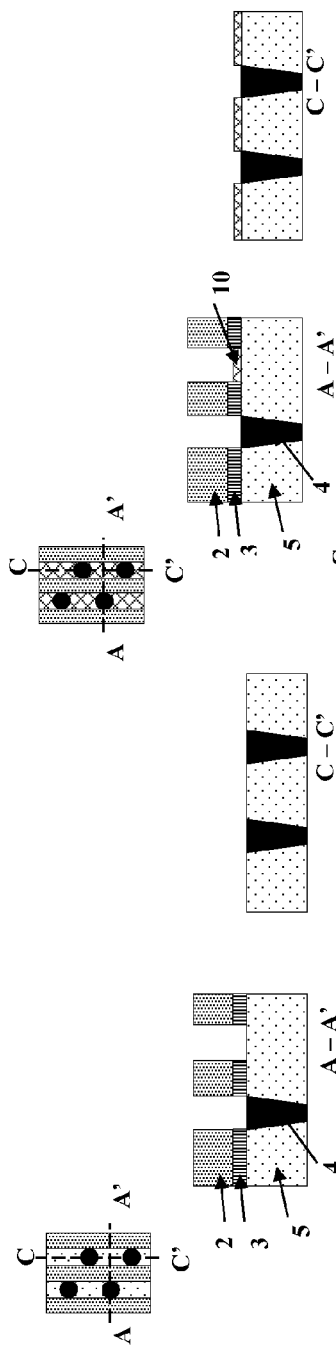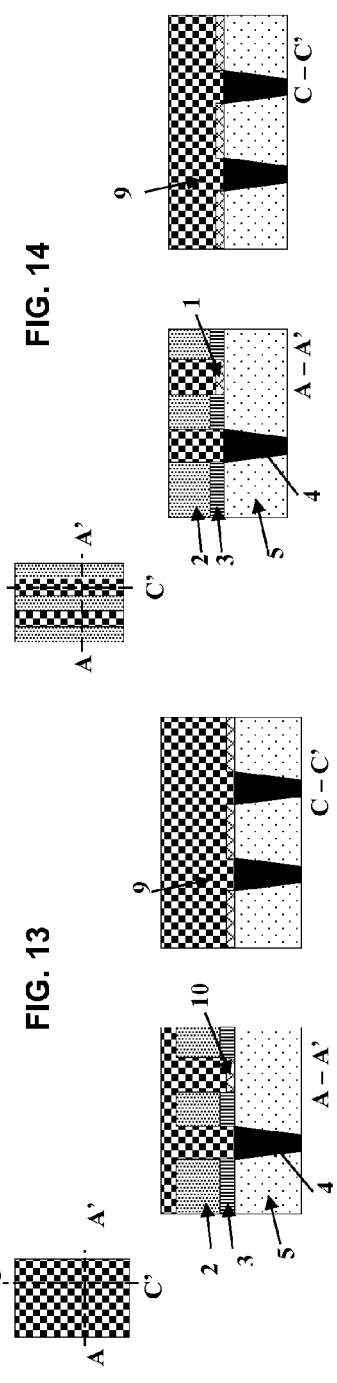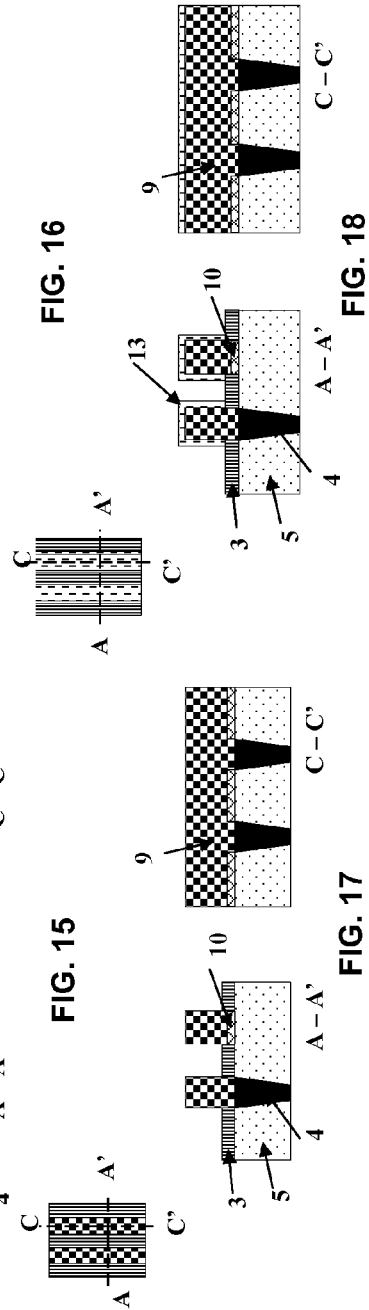

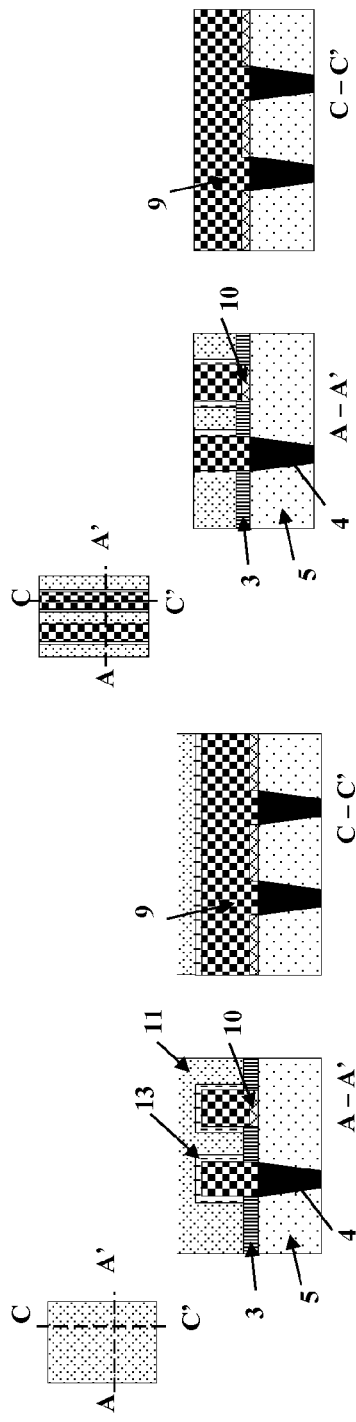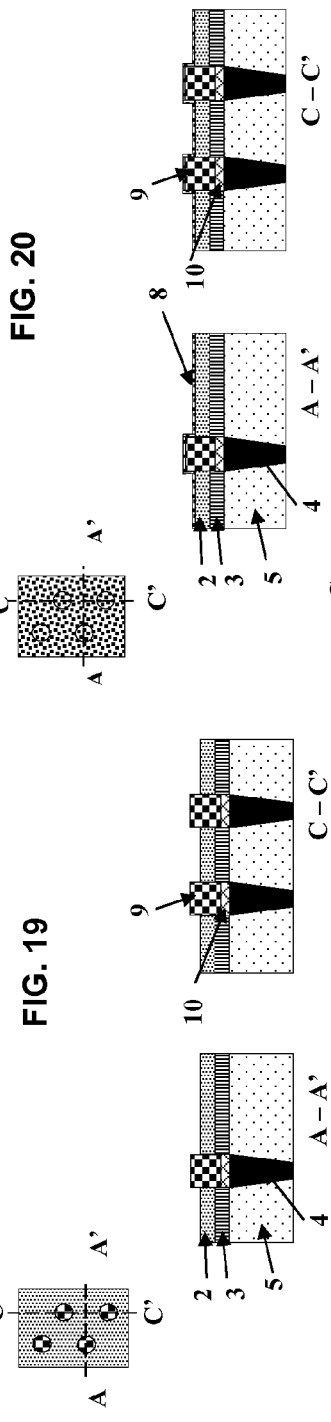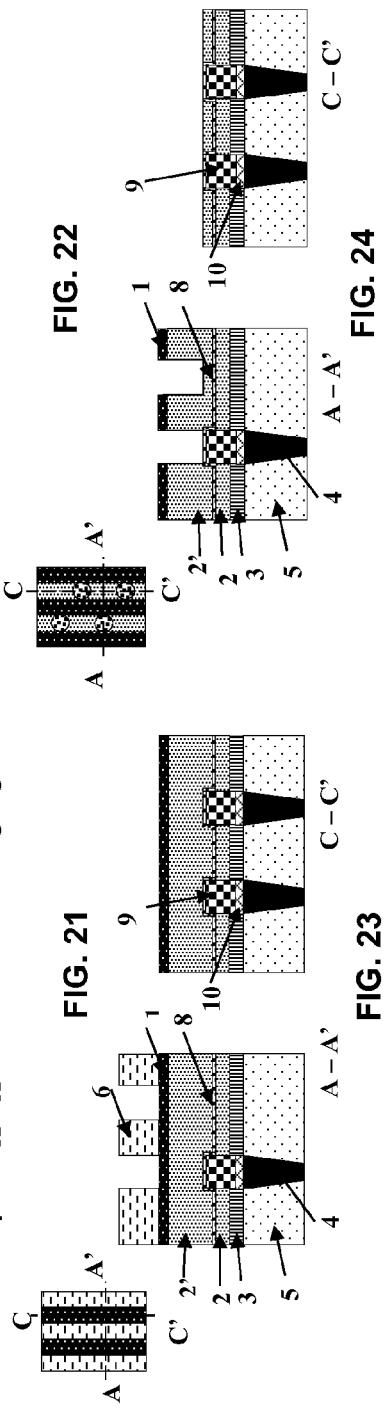

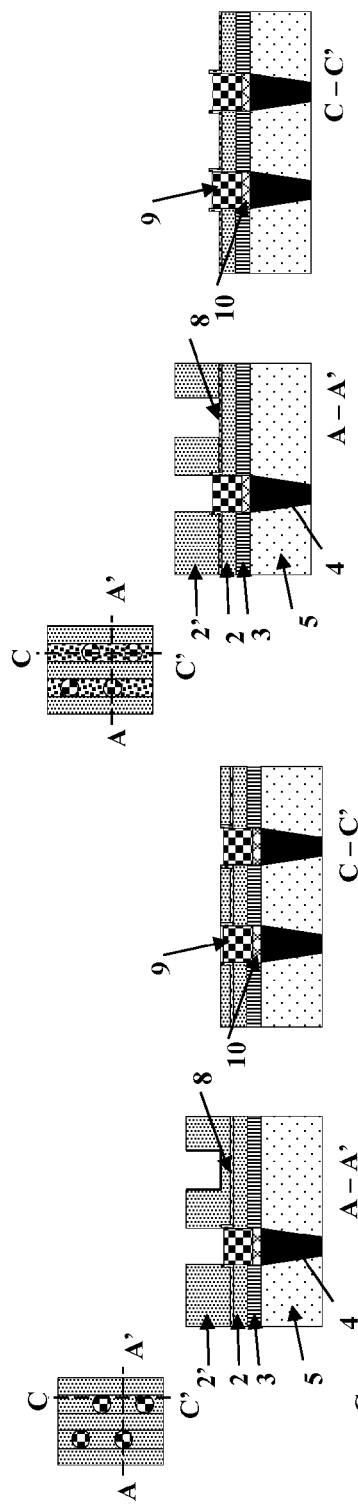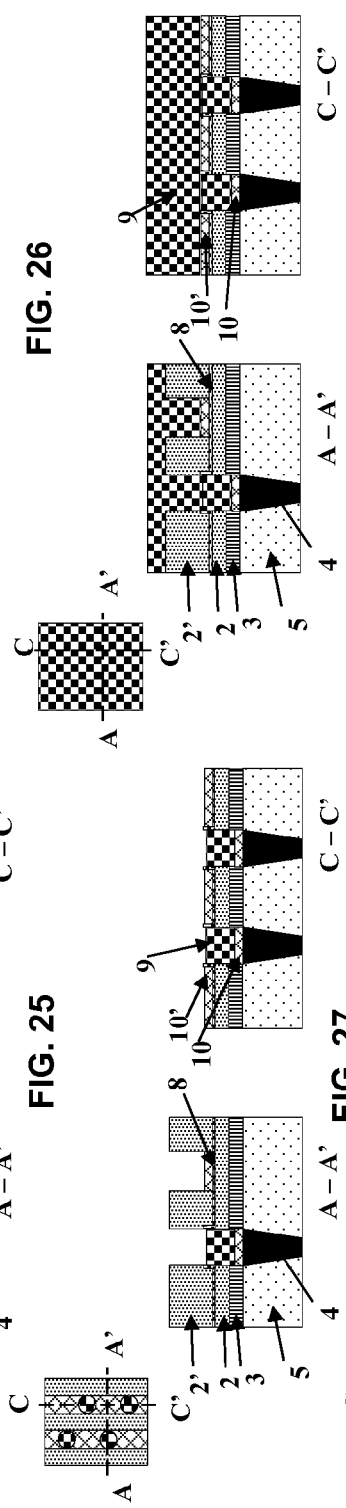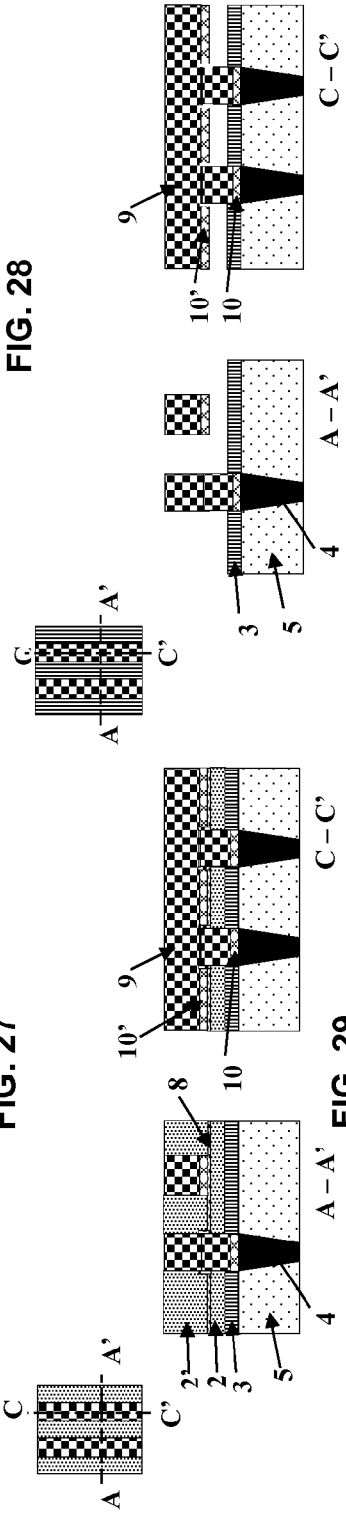

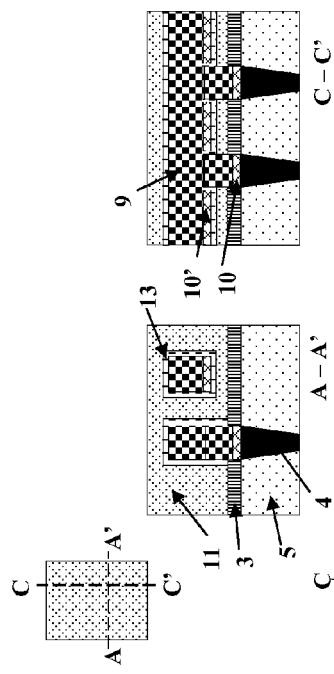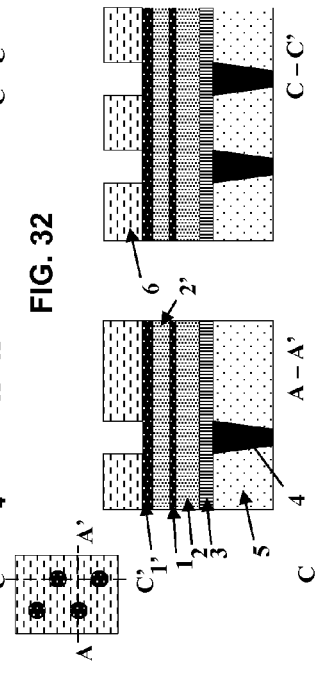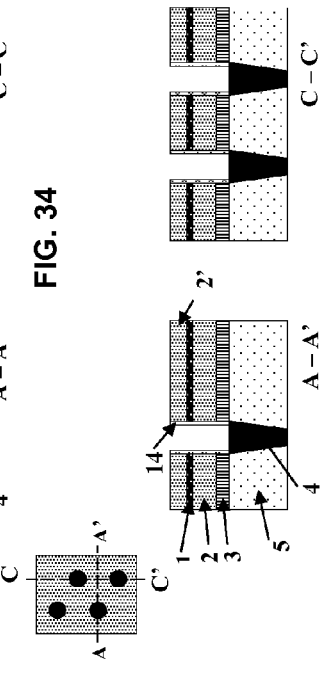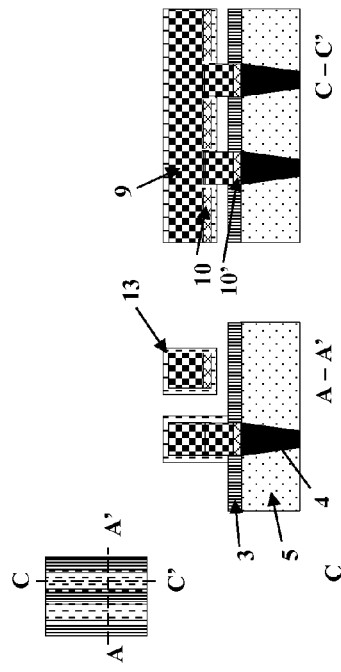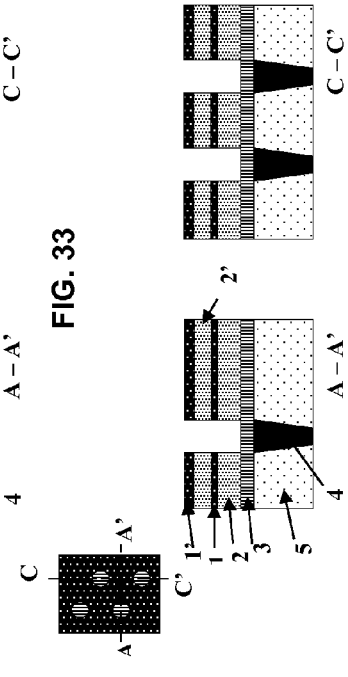
FIG. 31  FIG. 32  FIG. 33  FIG. 34  FIG. 35  FIG. 36

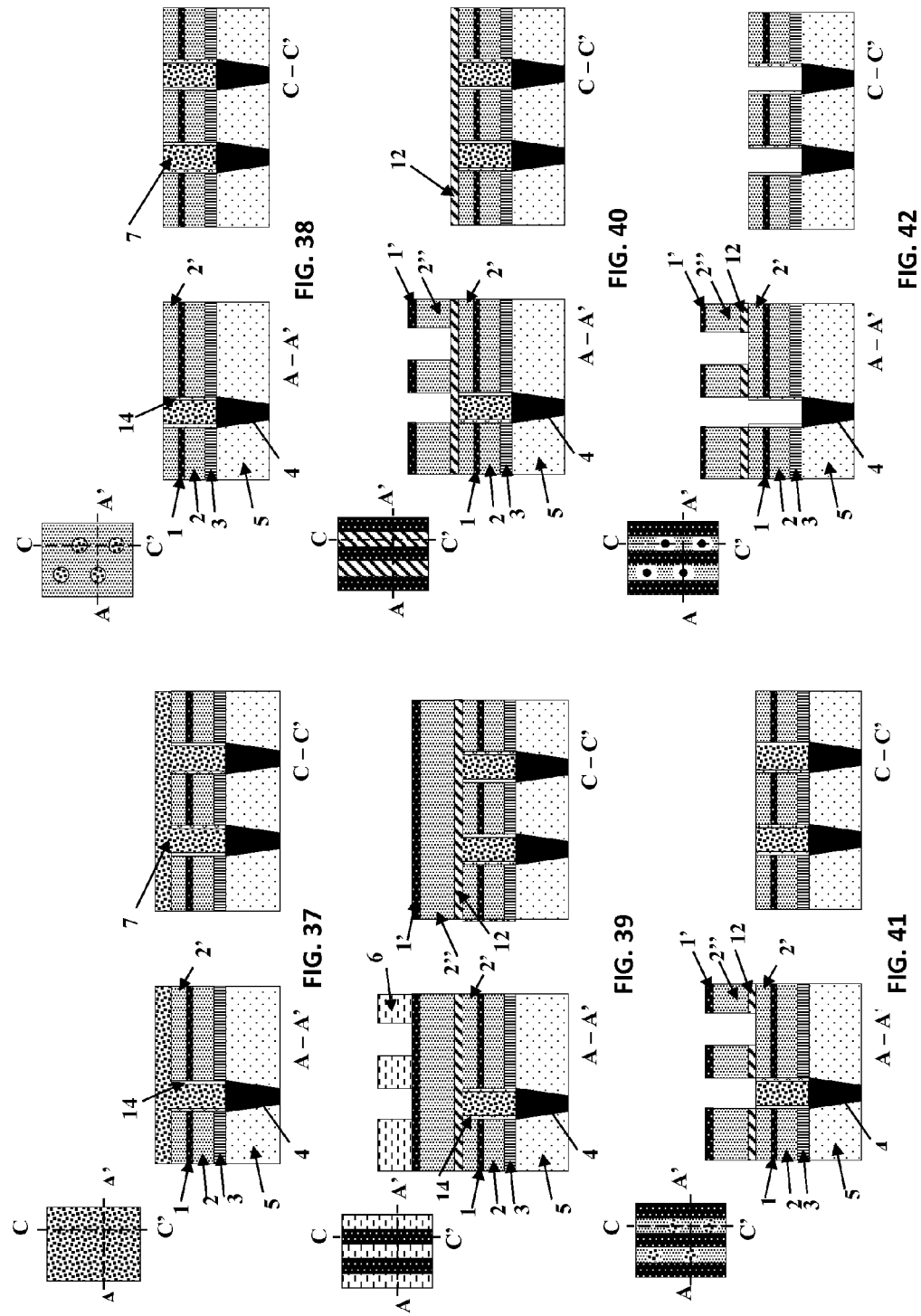

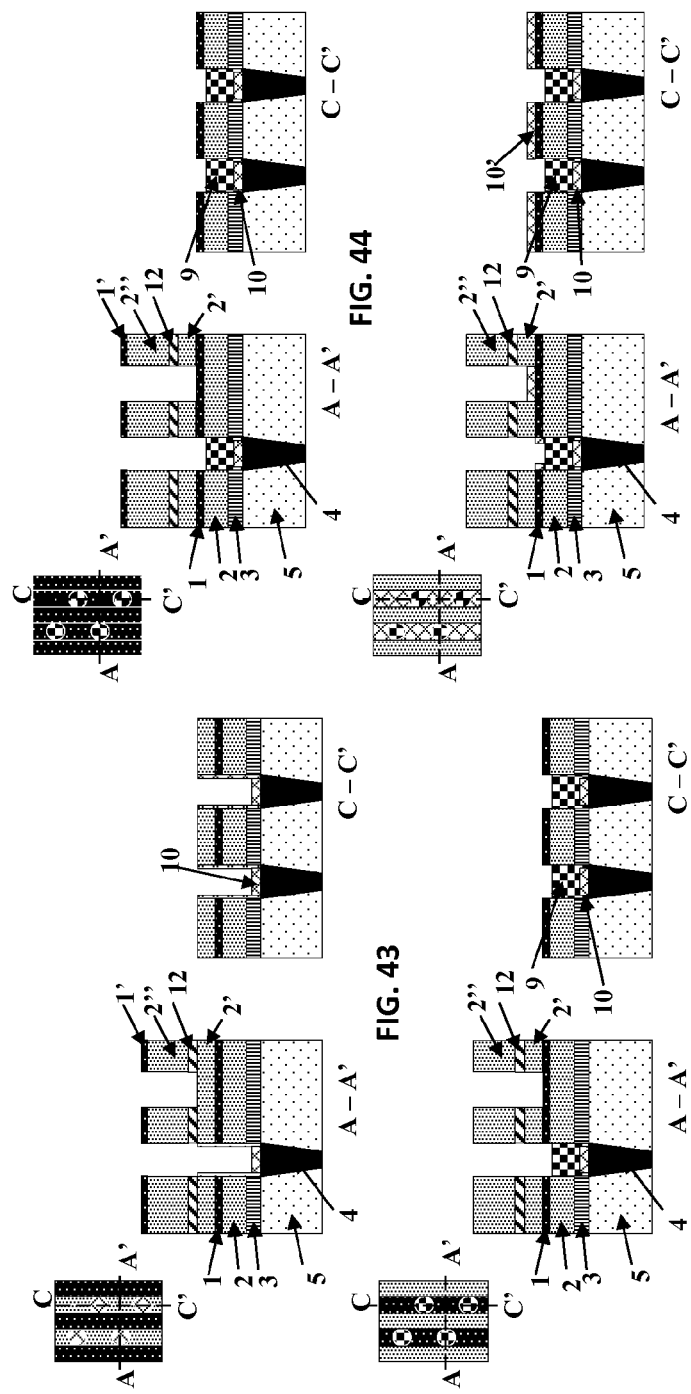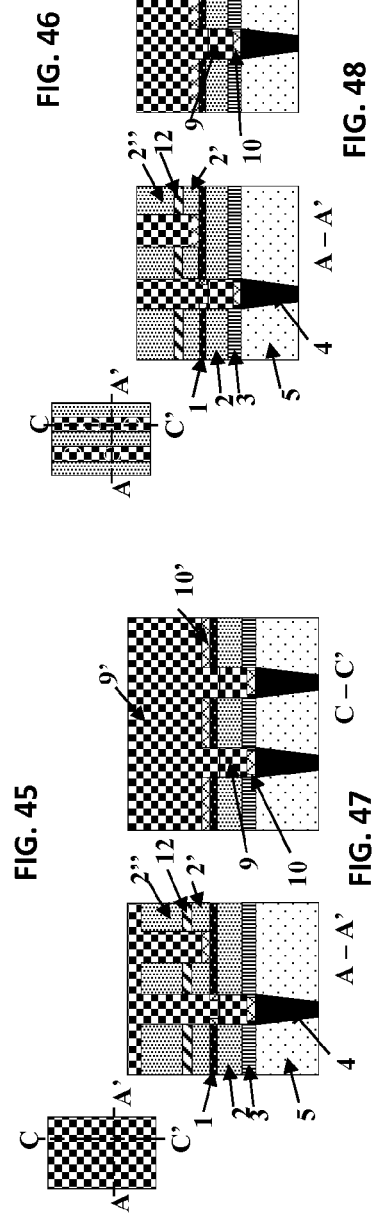

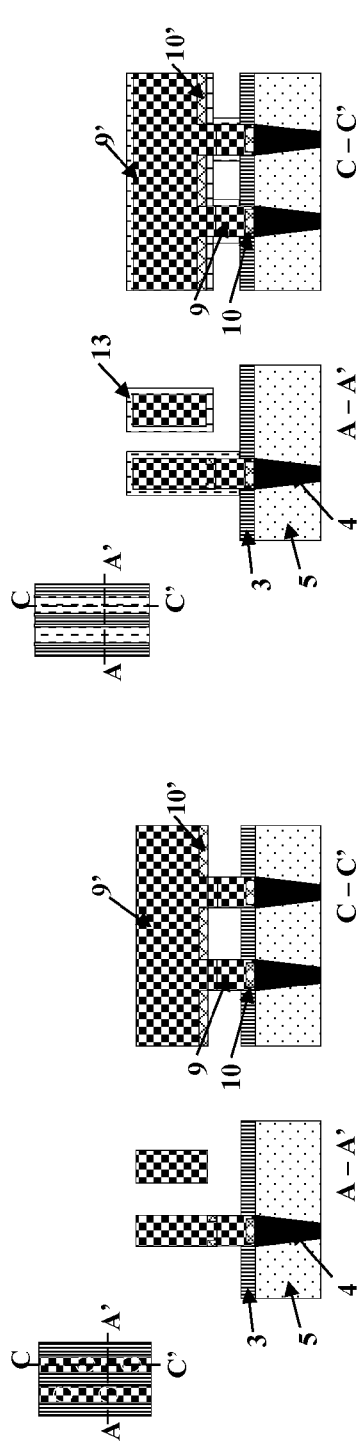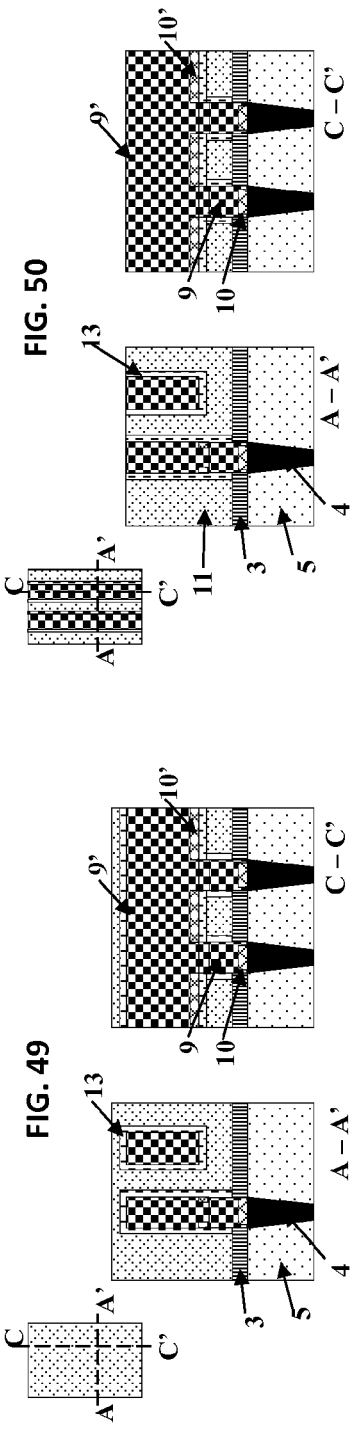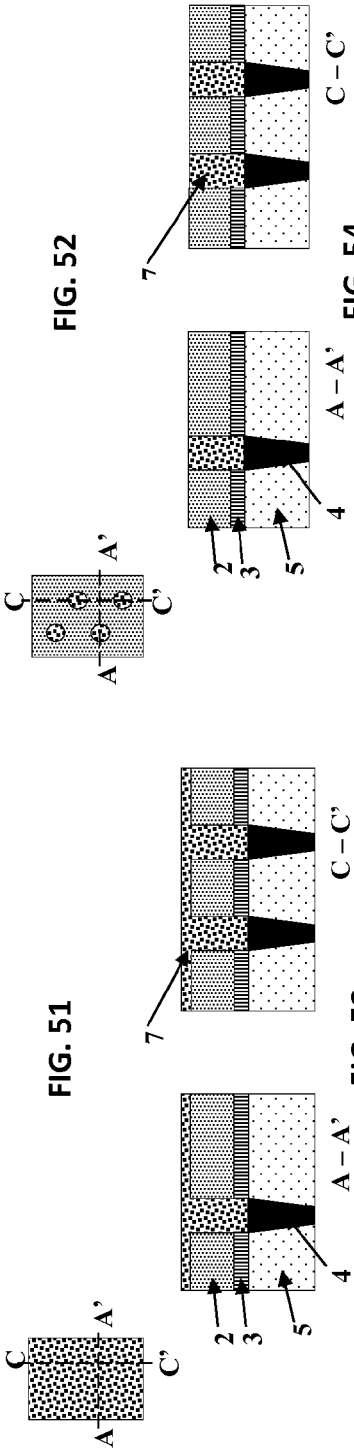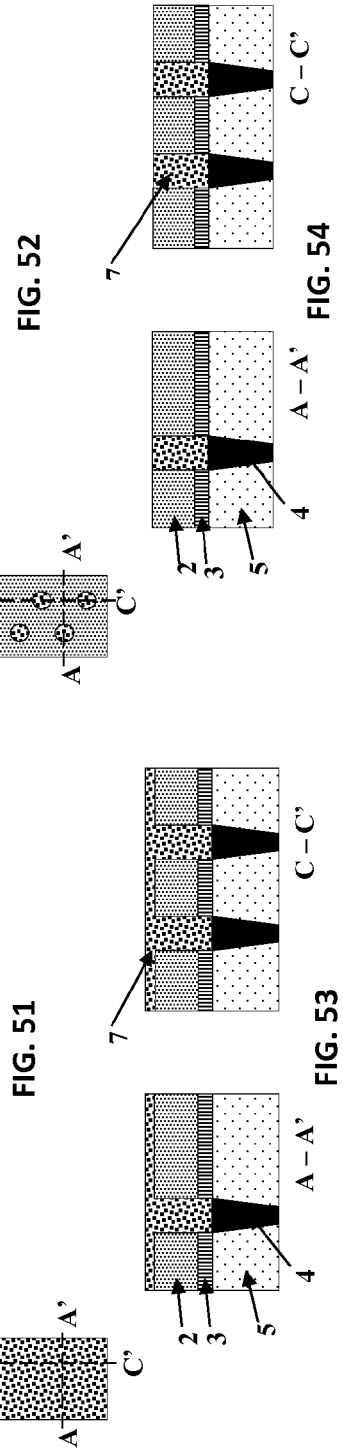

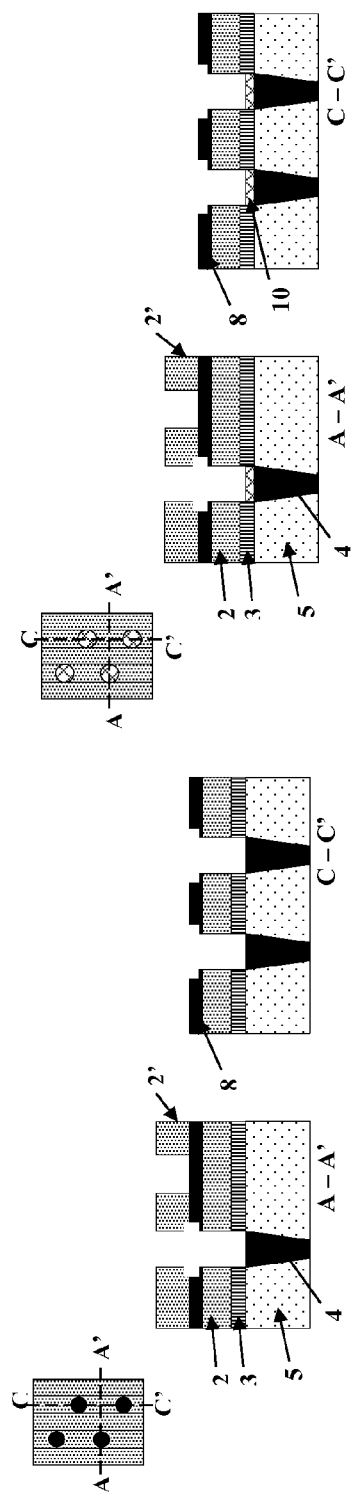
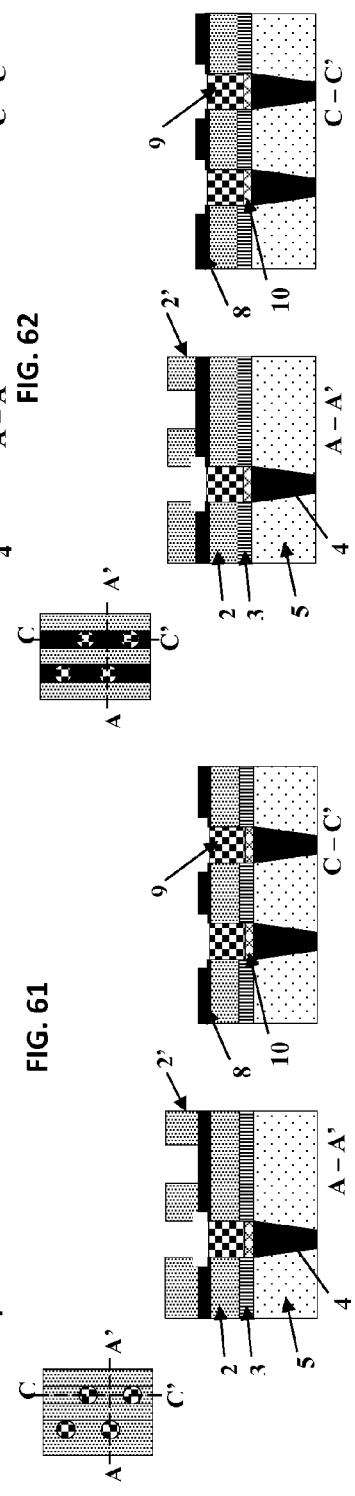
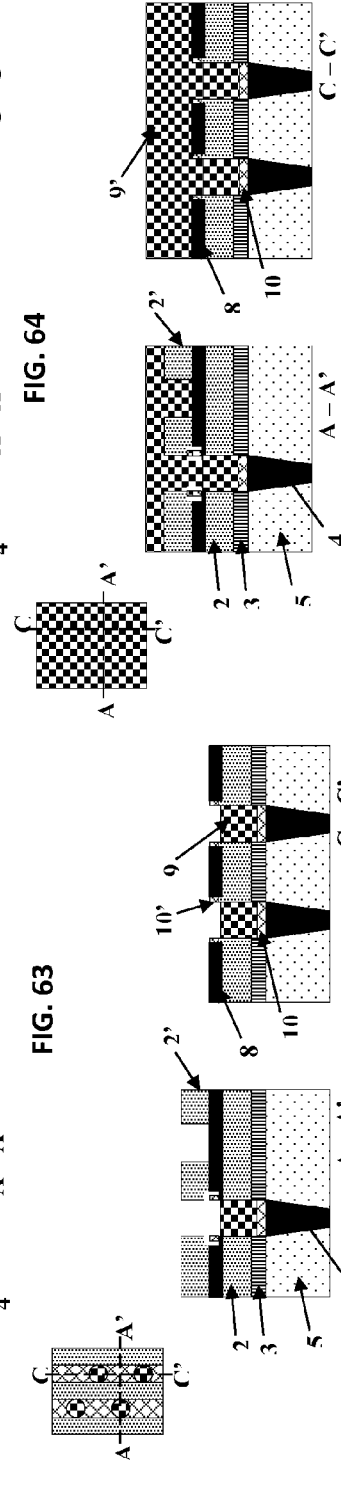

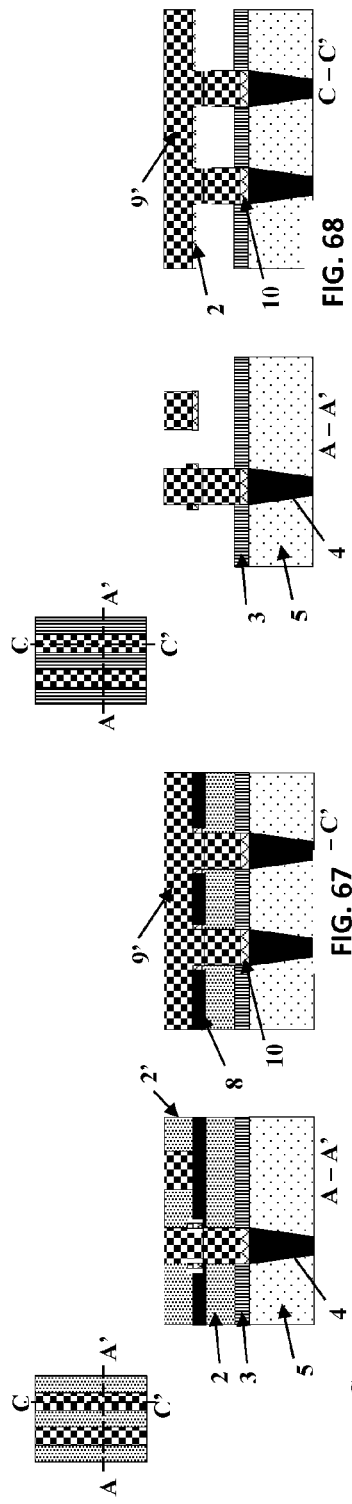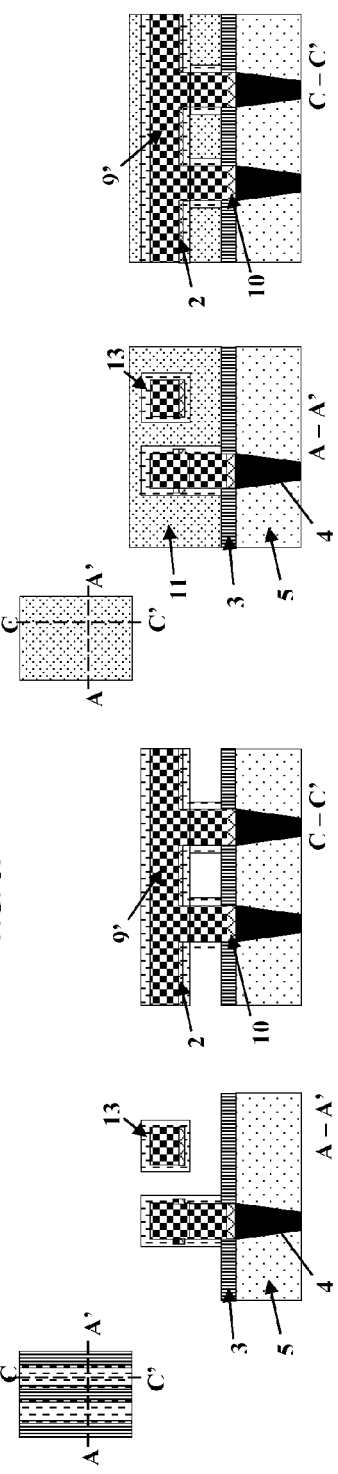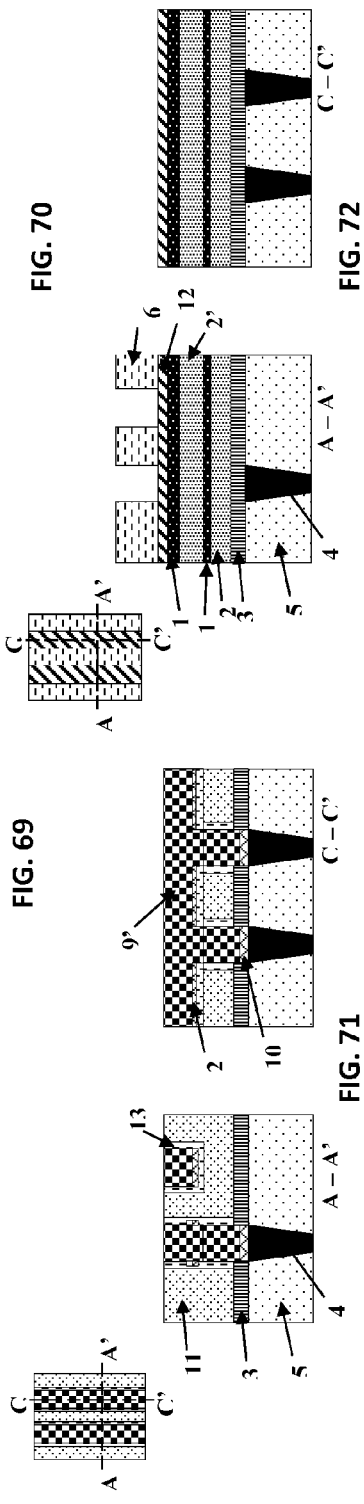

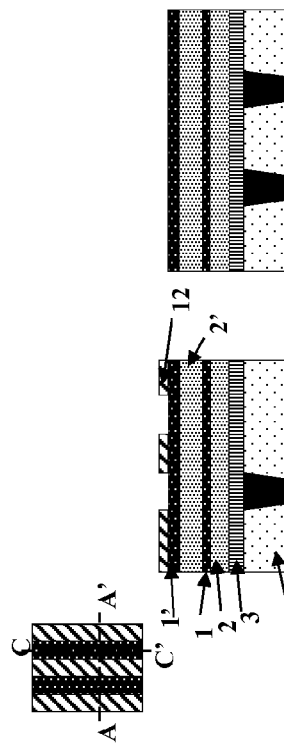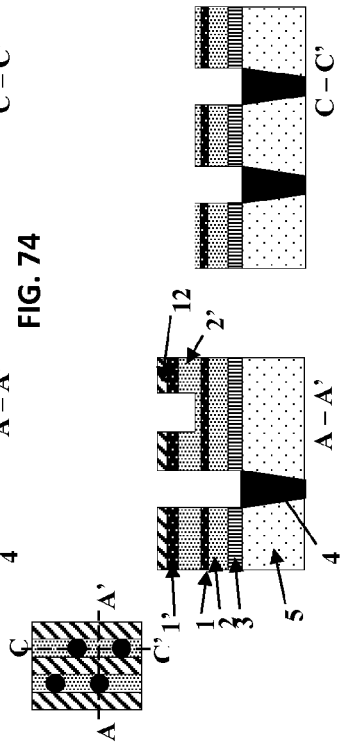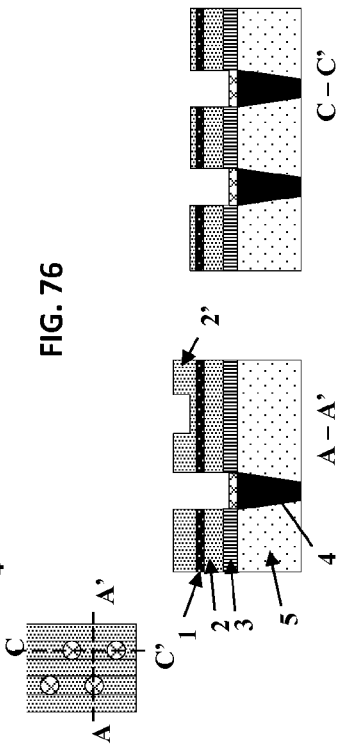

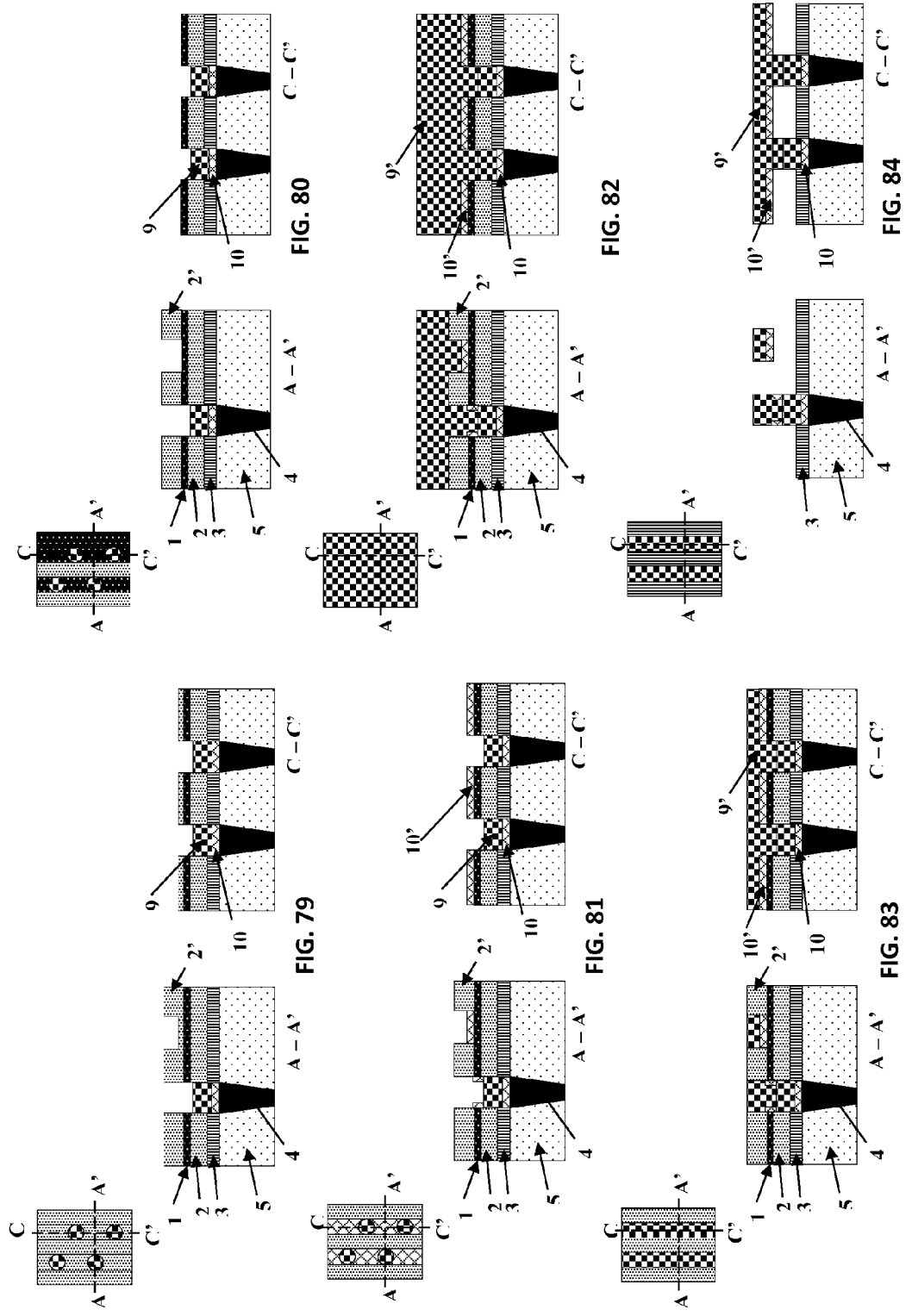

METALLIZATION METHOD FOR SEMICONDUCTOR STRUCTURES

CROSS-REFERENCE TO RELATED APPLICATION

The present application is a non-provisional patent application claiming priority to European Patent Application No. 14195695.3 filed Dec. 1, 2014, the contents of which are hereby incorporated by reference.

TECHNICAL FIELD

The present disclosure relates to the field of semiconductor fabrication methods and more specifically to the field of metallization methods.

BACKGROUND

U.S. Pat. No. 8,652,962 discloses a method for forming a dual damascene metal interconnect for a semiconductor device. The method comprises providing a semiconductor substrate, forming gate structures on the substrate through front end of line processing, forming a dielectric layer over the gate structures, patterning vias through the dielectric layer, forming a sacrificial layer over the low-k dielectric layer, patterning trenches through the sacrificial layer, filling the vias and trenches with metal, removing the sacrificial layer by means of a Chemical Mechanical Planarization (CMP) process, and forming an extremely low-k dielectric layer over the dielectric layer. This method aims at introducing low dielectric constant layers into semiconductor devices while avoiding damaging the extremely low-k dielectric. However, this method still introduces significant damage in the structures as it does not avoid defect formation in the metal structures, in the dielectric in which the vias are formed, and in the barrier lining the vias and trenches. There is, therefore, still a need for methods not suffering from these drawbacks.

SUMMARY OF THE DISCLOSURE

Embodiments of the present disclosure provide methods for the metallization of semiconductor structures.

It is an advantage of embodiments of the present disclosure that the damages caused during the metallization process may be low.

It is an advantage of embodiments of the present disclosure that they may lead to a low defect level in the metal structures obtained by filling vias and trenches. This advantage is achieved in embodiments by the combined use of strategically placed selective self-assembled monolayers (SAMs) and of sacrificial layers. This combined use permits an excellent bottom up filling of the vias and trenches, thereby avoiding defects observed when the filling of the vias or trenches proceeds at least in part from the side-walls of the vias and trenches. When the filling proceeds at least in part from the side walls, defects are unavoidable at the junction of the growth fronts stemming from opposite side walls. Other frequent defects observed when the filling proceeds at least in part from the side walls is the presence of voids in the vias and/or trenches due to an upper part of the via/trench being filled before a lower part is filled. This is particularly advantageous in the case of the 7 nm node technology or beyond where trenches and/or vias of lateral dimension equal to or less than 7 nm must be metallized.

The bottom-up filling has the further advantage that the vertical progression of the metallization can be better controlled by interrupting the growing of the metal when the top front of the growing metal reaches the top of the sacrificial layer(s) in which the via and/or trench was etched. This avoids or minimizes the use of the expensive CMP.

It is an advantage of embodiments of the present disclosure that by making use of a sacrificial layer for etching the vias and/or trenches, and by replacing it with a replacement dielectric layer (which may be a low-k layer) after metallization, the process is damage-free for the dielectric, even if plasma etching is used.

In a first embodiment, the present disclosure relates to a method for fabricating a semiconductor device. The method may include providing a structure comprising a first sacrificial layer comprising at least one through-hole exposing an underlying metal surface and optionally an underlying oxide surface. The method may also include applying a self-assembled monolayer selectively on the exposed metal surface and/or on the oxide surface. The method may further include growing a metal on the self-assembled monolayer, and on the exposed metal surface if no self-assembled monolayer is present thereon, so as to fill the at least one through-hole, thereby forming at least one metal structure. The method may also include replacing the first sacrificial layer by a replacement dielectric layer having a dielectric constant of at most 3.9.

In certain embodiments, applying a self-assembled monolayer selectively on the exposed metal surface and/or on the oxide surface may comprise applying a self-assembled monolayer selectively on the exposed metal surface, if no underlying oxide surface is exposed by the through-hole, or only on the exposed oxide surface if present.

When an oxide surface is exposed, applying a self-assembled monolayer selectively thereon is advantageous because it permits bringing the metal growth rate on the metal surface and the oxide surface closer to one another, thereby avoiding the creation of defects due to very different growth rates.

Preferably, the lateral dimensions of the underlying metal surface correspond to the lateral dimensions of the through-hole and the underlying metal surface is aligned with the through-hole.

Typically, the underlying metal surface may belong to a metal plug such as a tungsten plug.

Typically, the underlying oxide surface may be a $SiO_2$ surface.

In embodiments where the through-holes are vias, there may be at least as many underlying metal surfaces as vias, and each via may be aligned with an underlying metal surface.

In embodiments where the through-holes are trenches, there may be more underlying metal surfaces than trenches, and each trench may be aligned with one or more underlying metal surface.

Typically, if no underlying oxide is exposed by the through-holes, the through-holes are vias. Typically, when the through-holes are vias, the SAM is only applied on the exposed underlying metal surfaces.

Typically, if both a metal surface and an underlying oxide surface are exposed by the through-holes, the through-holes are trenches and the exposed underlying oxide surface is a portion of the underlying oxide surface aligned with the trench. Typically, when the through-holes are trenches, the SAM is only present on the exposed underlying oxide surfaces.

As used herein and unless provided otherwise, the SAMs promote the growth of metal on the device. They are also designed to attach selectively to the relevant underlying surface. For instance, SAMs suitable for attaching selectively to an underlying metal surface may comprise an organic compound of formula B—R-A, where A is selected from SH, SeH, TeH, R is a hydrocarbyl comprising from 2 to 20 carbon atoms, and B is a polar group suitable for promoting metal growth.

Alternatively, SAMs suitable for attaching selectively to an underlying oxide surface may comprise an organic compound of formula B—R—$SiX_3$, where X is selected from H, Cl, O—$CH_3$, O—$C_2H_5$, and O—$C_3H_7$, R is a hydrocarbyl comprising from 2 to 20 carbon atoms, and B is a polar group suitable for promoting metal growth. Examples of such polar groups are primary and secondary amine groups, mercapto groups, and carboxylic groups.

By applying the SAM selectively on the exposed metal surface, if no underlying oxide surface is exposed by the through-hole, or on the oxide surface if present, no SAM is present on the side walls of the through-holes. This is advantageous as it promotes a bottom-up growth of the metal and prevents metal growth from the side-walls which causes defects at the junction of the growth fronts stemming from opposite side walls or causes the presence of voids in the vias and/or trenches due to an upper part of the via/trench being filled before a lower part is filled.

The "underlying" layer is a layer lying under the sacrificial layer.

As used herein and unless provided otherwise, the (first, second and third) sacrificial layers may be formed of a material that decomposes and/or vaporizes by thermal treatment at a temperature between 250 and 450° C., by UV treatment, or by a combination of those treatments. Preferably, the sacrificial layer is an organic sacrificial layer. Organic sacrificial layers form walls on which metal growth is not promoted, thereby favouring bottom-up metal growth. Furthermore, organic sacrificial layers can be removed easily. For instance, the organic sacrificial layers can be removed by means of a dry strip process such as plasma stripping. A dry strip process helps to avoid pattern collapse. Non-organic trench walls such as oxide walls typically require a wet etching, which tends to lead to pattern collapse during developing and/or rinsing due to capillary force. The organic sacrificial layers may, for instance, be deposited by spin-coating or plasma enhanced chemical vapour deposition (PECVD). Typical examples include spin-on-carbon (SOC) and advanced patterning film (APF). APF is deposited by PECVD. Further examples are organic polymers such as polymethyl methacrylate, polyimide, polypropylene glycol, polybutadiene, polyethylene glycol, and polycaprolactonediol, amongst others.

In various embodiments, metal grown on the device may be any metal suitable for forming an interconnect or a conducting line. Examples are Cu, Co, Ni, and Ru.

In various embodiments, the replacement dielectric layer may be a low-k dielectric layer, e.g., a layer having a dielectric constant lower than 3.9 and preferably lower than 2.4. Examples of low-k dielectric materials are silicate glasses such as carbon-doped silicon dioxide and fluorine-doped silicon dioxide. In order to have a lower dielectric constant, the replacement dielectric layer may be porous. For instance it may have a porosity of at least 20%.

In embodiments where the at least one through-holes is at least one via, a method for semiconductor device fabrication may include providing a device with a first sacrificial layer having at least one via exposing a metal surface. The method may also include applying a self-assembled monolayer selectively on the exposed metal surface. The method may further include growing a metal on the self-assembled monolayer so as to fill the at least one via, thereby forming at least one metal pillar. The method may also include replacing the first sacrificial layer by a replacement dielectric layer having a dielectric constant of at most 3.9.

In the previous embodiment, if the device includes both at least one via and at least one trench, the device may further include a first dielectric layer overlying the first sacrificial layer and a second sacrificial layer overlying the first dielectric layer. The method may further include, before applying the self-assembled monolayer, covering the side walls of the via with a passivation layer such as a hydrophilic layer (e.g. a hydrophilic polymer); filling the at least one via with a dielectric material so that the top surface of the dielectric material and the top surface of the second sacrificial layer are substantially coplanar; overlying the dielectric material and the second sacrificial layer with a hard mask; overlying the hard mask with a third sacrificial layer; overlying the third sacrificial layer with a second dielectric layer; etching one or more trenches through the second dielectric layer, the third sacrificial layer, and the hard mask so that at least one of the trenches is aligned with at least one via, thereby exposing the dielectric material and part of the second sacrificial layer; and removing the dielectric material, thereby exposing the metal surface.

This is advantageous as it permits having both the vias and the trenches formed in sacrificial layers. This permits the replacement of the sacrificial layers by a replacement dielectric layer having a dielectric constant of at most 3.9. This replacement layer surrounds both the vias and the trenches and has a low amount of defects since it does not suffer etching-induced damages. An advantage of this embodiment is that it enables a dual damascene process, i.e. a process where both the via and the trenches are formed prior being filled with a metal. Such a process has the advantage that a single CMP is sufficient after metallization. CMP is a very expensive step. Furthermore, by etching the via through two sacrificial layers, controlling uniformity of the layers is easier than in the alternative option (see FIGS. 54-71) where uniformity must be maintained during partial etching of the first sacrificial layer (causing a top portion of at least one dielectric pillar to protrude out of the first sacrificial layer). Also, the absence of a protruding pillar makes uniformity control easier.

As used herein and unless provided otherwise, the first dielectric layer, the second dielectric layer, and the third dielectric layer may be the same or different material and may, for instance, comprise carbon-doped silicon oxide (SiOC), $SiO_2$, SiON, $Si_3N_4$ or a spin-on-glass.

In various embodiments, the passivation layer may be formed as a side product of the etching process (typically a plasma etching process using a hydrocarbon and/or hydrofluorocarbon gas).

As used herein and unless provided otherwise, the hard mask may be any hard mask but is preferably a metal hard mask such as AlN or TiN.

In the above embodiment, when growing metal on the self-assembled monolayer, the metal may fill the at least one via only partially (e.g., below the first dielectric layer or up to the level of the first dielectric layer). Additionally, the method may further include, after growing the metal on the self-assembled monolayer and before replacing the first sacrificial layer, removing the exposed passivation layer and removing the second sacrificial layer from within the trenches so as to expose part of the first dielectric layer, removing the second dielectric layer, applying a self-assembled monolayer selectively on the first dielectric layer, and growing a metal on the self-assembled monolayer and on the metal in order to complete the filling of the at least one via and to fill the at least one trench.

This is advantageous because it permits only partially filling the vias at first before filling the trenches and the rest of the vias. If both vias and trenches were filled simultaneously from the beginning, the metal growing in trenches could, in some instances, cover the vias before the completion of their filling, thereby creating voids in the vias.

In various embodiments, the method of fabricating a semiconductor device may further include, before selectively applying a self-assembled monolayer, filling at least one via with a dielectric material so that the top surface of the dielectric material and the top surface of the first sacrificial layer are substantially coplanar, thereby forming at least one dielectric pillar; etching part of the first sacrificial layer until a top portion of at least one dielectric pillar stands out of the first sacrificial layer; overlaying what remains from the first sacrificial layer and the top portion of at least one dielectric pillar with a conformal dielectric layer; providing a second sacrificial layer on the conformal dielectric layer; providing a dielectric layer on the second sacrificial layer; forming at least one trench in the dielectric layer, the second sacrificial layer, and the conformal dielectric layer in such a way as to expose the top surface of at least one dielectric pillar; and removing the dielectric pillar, thereby exposing the metal surface.

This represents an alternative way to have both vias and trenches formed in sacrificial layers. This permits the replacement of the sacrificial layers by a replacement dielectric layer which can be a low-k dielectric layer. This replacement layer surrounds both the vias and the trenches and has a low amount of defects since it has not suffered etching-induced damages. An advantage of this embodiment is that it enables a dual damascene process, i.e. a process where both the via and the trenches are formed prior to being filled with a metal. Such a process has the advantage that a single CMP is sufficient after metallization.

As used herein and unless provided otherwise, the conformal dielectric layer may, for instance, be a dielectric layer deposited by atomic layer deposition (ALD). For instance, it can be a $SiO_2$ or a $Si_3N_4$ layer deposited by ALD.

In another embodiment, when growing a metal on the self-assembled monolayer, the metal may fill at least one via only partially (e.g. below the conformal dielectric layer or up to the level of the conformal dielectric layer) and the method may further include, after growing the metal and before replacing the sacrificial layer, removing the second sacrificial layer from within the trenches so as to expose the underlying conformal dielectric layer, applying a further self-assembled monolayer selectively on the exposed conformal dielectric, and growing a metal on the further self-assembled monolayer and on the metal in order to fill at least one trench.

This is advantageous because it permits only partially filling the vias at first, before filling the trenches and the rest of the vias. If both vias and trenches were filled simultaneously from the beginning, the metal growing in trenches could, in some instances, cover the vias before the completion of their filling, thereby creating voids in the vias.

In another embodiment, the device includes a first sacrificial layer, a first dielectric layer and a second sacrificial layer, and at least one via is cutting through each of these layers. The second sacrificial layer may further include at least one trench aligned with one or more vias. The embodiment may further include growing metal on the device until it fills the vias only up to below the first dielectric layer. The embodiment may further include, after growing the metal and before replacing the first sacrificial layer, removing the second sacrificial layer from within the trenches so as to expose part the first dielectric layer, applying a self-assembled monolayer selectively on the exposed first dielectric layer, and growing a metal on the self-assembled monolayer and on the metal in order to complete the filling of the vias and to fill the trenches.

This also represents an alternative way that permits having both the vias and the trenches formed in sacrificial layers. This permits the replacement of the sacrificial layers by a replacement dielectric layer which can be a low-k dielectric layer. This replacement layer surrounds both the vias and the trenches and has a low amount of defects since it has not suffered etching-induced damages. An advantage of this embodiment is that it enables a dual damascene process, i.e. a process where both the via and the trenches are formed prior to their filling with a metal. Such a process has the advantage that a single CMP is sufficient after metallization.

In another embodiment, providing a structure including a first sacrificial layer having at least one via exposing a metal surface may include providing a first oxide layer having a thickness intersected by at least one metal element, overlaying the first oxide layer with an etch block layer, overlaying the etch block layer with the first sacrificial layer, overlaying the first sacrificial layer with a first dielectric layer, overlaying the first dielectric layer with a second sacrificial layer, overlaying the second sacrificial layer with a second dielectric layer, overlaying the second sacrificial layer with a hard mask, overlaying the hard mask with the patterned photoresist comprising at least one trench opening corresponding to at least one trench to be formed, etching the hard mask through the trench opening so as to expose part of the second dielectric layer, removing the patterned photoresist, overlaying the metal hard mask and the exposed parts of the second dielectric layer with another patterned photoresist comprising at least one via opening corresponding to at least one via to be formed directly above the at least one trench, etching the second dielectric layer, the second sacrificial layer, the first dielectric layer, and the first sacrificial layer through the at least one via opening so as to expose part of the etch block layer, removing the other patterned photoresist, etching the exposed etch block layer and the second dielectric layer through the metal hard mask so as to expose the top metal surface of the metal element and so as to stop before reaching the first dielectric layer, and removing the hard mask and the second dielectric layer.

This embodiment has the advantage that both vias and trenches can be etched in a single etching step. This embodiment has the further advantage that by forming the trench before the via, the via becomes self-aligned due to the presence of the trench pattern in the hard mask. As a result, the alignment of the via and the trench can be improved since they are formed in a single etching step. This is particularly advantageous for narrow trenches and vias having a lateral dimension of 10 nm or less or even 7 nm or less.

As used herein and unless provided otherwise, the term "etch block layer" may be any layer suitable for resisting etching conditions used to etch the sacrificial layer and which can be etched selectively to an exposed metal surface. For instance, nitrogen-doped silicon carbide (SiCN) and oxygen-doped silicon carbide (SiCO) are suitable.

In any of the embodiments disclosed herein, growing a metal on the self-assembled monolayer may include growing a metal on the self-assembled monolayer so as to fill at least one via on and to cover the first sacrificial layer top surface, followed by chemical mechanical planarization until all metal present on the first sacrificial layer top surface has been removed.

In another embodiment, a method of fabricating a semiconductor device may also include, after growing a metal on the self-assembled monolayer and before replacing the first sacrificial layer with a dielectric layer, etching part of the first sacrificial layer until a top portion of each of the at least one metal pillar stands out of the first sacrificial layer, overlaying what remains of the first sacrificial layer and the top portion of the at least one metal pillar with a conformal dielectric layer, providing a second sacrificial layer on the conformal dielectric layer, forming at least one trench in the second sacrificial layer in such a way as to expose the top surface of each of the at least one metal pillar and a portion of the conformal dielectric layer, applying a self-assembled monolayer selectively on the exposed conformal dielectric layer, and growing a metal on the self-assembled monolayer and on the exposed top surface of the at least one metal pillar, so as to fill the at least one trench.

In this embodiment, the vias are created and filled first, then the trenches are created and filled. This represents yet another alternative for having both the vias and the trenches formed in sacrificial layers.

In this embodiment, overlaying the hard mask with a third sacrificial layer may include overlaying the second sacrificial layer with a dielectric layer, overlaying the dielectric layer with a patterned photoresist having at least one opening corresponding to at least one trench to be formed, etching the dielectric layer and the second sacrificial layer through the at least one opening so as to expose the conformal dielectric layer covering the at least one metal pillar, removing the dielectric layer and the exposed conformal dielectric layer covering the at least one metal pillar, and etching the second sacrificial layer until the conformal dielectric layer is exposed in the at least one trench.

In these embodiments, growing a metal on the self-assembled monolayer may include growing a metal on the self-assembled monolayer and on the exposed top surface of the at least one metal pillar, so as to fill the at least one trench and to cover the second sacrificial layer top surface, followed by chemical mechanical planarization until all metal present on the second sacrificial layer top surface has been removed.

The first embodiment of the present disclosure can also be implemented for the formation of trenches alone. In that case, the method may include providing a structure with a sacrificial layer having at least one trench exposing a metal surface and an oxide surface, applying a self-assembled monolayer selectively on the exposed oxide surface, growing a metal on the self-assembled monolayer and on the metal surface so as to fill the at least one trench, and replacing the sacrificial layer by a replacement dielectric layer having a dielectric constant of at most 3.9.

In various embodiments, providing a structure with a sacrificial layer having at least one trench exposing a metal surface and an oxide surface may include providing an oxide layer having a thickness intersected by at least one metal element, overlaying the oxide layer with an etch block layer, overlaying the etch block layer with the first sacrificial layer, overlaying the first sacrificial layer with a first dielectric layer, providing a patterned photoresist on top of the first dielectric layer with at least one opening corresponding to the at least one through-hole to be formed, etching the first dielectric layer and the first sacrificial layer so as to form the at least one through-hole, thereby exposing a portion of the etch block layer, removing the photoresist, and removing the first dielectric layer and etching the portion of the etch block layer so as to expose the top metal surface of the metal element.

In any embodiments disclosed herein, replacing the sacrificial layer by a replacement dielectric layer may include removing all sacrificial layers, the conformal dielectric layer if present, and the first dielectric layer if present, thereby exposing the at least one metal element, surrounding the metal element with a replacement dielectric layer having a dielectric constant of at most 3.9, and performing a chemical mechanical planarization of the replacement dielectric layer having a dielectric constant of at most 3.9 until the top surface of the metal element is exposed.

Also if the metal structure is a copper structure, prior to surrounding the metal with a replacement dielectric layer, the exposed metal structure may be selectively coated with a barrier layer. To achieve selectivity for the barrier deposition, several options are available: in a first embodiment, a SAM inhibiting the barrier deposition can be deposited selectively on the etch block layer, and then a barrier (e.g., a Ta/TaN barrier wherein Ta assures the adhesion of the barrier to the copper and TaN enhances the Cu diffusion barrier properties of the barrier) can be deposited selectively on the metal (e.g., by ALD or CVD). After deposition of the barrier, the SAM can be removed. This embodiment has the advantage of allowing the deposition of a relatively thin barrier. In a second embodiment, a SAM selective to the metal and suitable for use as a barrier can be used. In a third embodiment, a barrier can be grown selectively on the metal by means of an electroless process. NiB and CoWP barriers can be grown that way. An advantage of the second and third embodiment is that no SAM needs to be deposited on the etch block layer, which means that no SAM will need to be removed after the barrier deposition.

In any etching step of any embodiment of the present disclosure, the etching method may be adapted to the material to be etched as is well known to a person skilled in the art.

Particular and preferred aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change, and evolution of devices in this field, the present concepts are believed to represent substantial new and novel improvements, including departures from prior practices, resulting in the provision of more efficient, stable, and reliable devices of this nature.

The above and other characteristics, features, and advantages of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

DESCRIPTION OF THE DRAWINGS

FIGS. 1-10 illustrate vertical cross-sections and a plan view of semiconductor devices according to a first example embodiment.

FIGS. 11-20 illustrate vertical cross-sections and a plan view of semiconductor devices according to a second example embodiment.

FIGS. 21-33 illustrate vertical cross-sections and a plan view of semiconductor devices according to a third example embodiment.

FIGS. 34-53 illustrate vertical cross-sections and a plan view of semiconductor devices according to a fourth example embodiment.

FIGS. 54-71 illustrate vertical cross-sections and a plan view of semiconductor devices according to a fifth example embodiment.

FIGS. 72-87 illustrate vertical cross-sections and a plan view of semiconductor devices according to a sixth example embodiment.

DETAILED DESCRIPTION

Figures 55, 56, 57, 58, 59, 60:
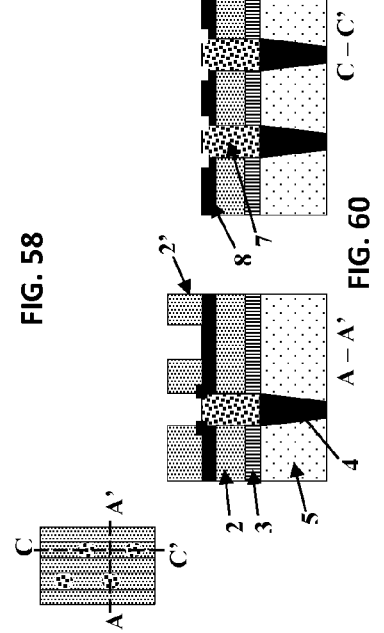

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemple embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the disclosure.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

The disclosure will now be described by a detailed description of several embodiments of the disclosure. It is clear that other embodiments of the disclosure can be configured according to the knowledge of persons skilled in the art without departing from the true spirit or technical teaching of the disclosure, the disclosure being limited only by the terms of the appended claims.

In each of the following figures, three schemes are shown. The top left scheme is a top view of the device in construction, the bottom left scheme is a vertical cross-section through the A-A' axis and the bottom right scheme is a vertical cross-section through the C-C' axis.

A first example embodiment is depicted in FIGS. 1-10. Referring to FIG. 1, a device is illustrated which includes an oxide layer 5 (e.g. $SiO_2$) having a thickness crossed by at least one metal element 4 (e.g. a tungsten plug), an etch block layer 3 (e.g. a SiCN or SiCO layer) overlying the oxide layer 5 and the metal element 4, a sacrificial layer 2 (e.g. an organic layer such as an APF layer) overlying the etch block layer 3, a dielectric layer 1 (e.g. a SiOC, a $SiO_2$/SiON, a spin-on-glass, or a $Si_3N_4$ layer) overlying the sacrificial layer 2, and a patterned photoresist 6 overlying the dielectric layer 1. The patterned photoresist 6 includes at least one opening corresponding to at least one via to be formed. That the opening corresponds to a via means that the opening has lateral dimensions suitable for obtaining the desired via. Typically, this means that the lateral dimensions of the opening are the same as those of the via. The photoresist may be patterned by using a photolithographic mask.

FIG. 2 shows the device after etching through the at least one opening of the dielectric layer 1 and the sacrificial layer 2. Via holes are cut through both the dielectric layer 1 and the sacrificial layer 2 exposing a portion of the etch block layer 3. The photoresist may be removed during or after this step. FIG. 3 illustrates the device after the dielectric layer 1 and the etch block layer 3 have been etched. The via extends through the etch block layer 3 and the top surface of the metal element 4 is exposed. FIG. 4 illustrates the device after a self-assembled monolayer (SAM) 10 is applied selectively on the exposed surface of the metal element 4.

FIG. 5 illustrates the device after a metal 9 (e.g., copper, but alternative metals are possible) is grown on the SAM 10. The at least one via is thereby filled, forming at least one metal structure 9. The metal structure 9 extends above the via and covers the sacrificial layer 2. FIG. 6 shows the device after the metal structure 9 is planarized by CMP until all portions of the metal structure 9 on the top surface of the sacrificial layer 2 are removed, causing the top surface of the metal structure 9 and the top surface of the sacrificial layer 2 to be substantially co-planar. FIG. 7 illustrates the device after the sacrificial layer 2 is removed, thereby exposing the at least one metal structure 9.

FIG. 8 illustrates the device after the at least one metal structure 9 is selectively surrounded by a barrier 13 (e.g., Ta/TaN). The barrier 13 is advantageous when the metal structure 9 is copper. When the metal structure 9 is an alternative metal, a barrier is typically not necessary. To deposit the barrier, a hydrophobic SAM selective to the etch block layer may be deposited to inhibit deposition of the barrier 13. The barrier 13 may then be deposited by Atomic Layer Deposition (ALD) on the metal structure 9. Finally, the hydrophobic SAM may be removed. An alternative to the use of ALD is CVD. To achieve selectivity for the barrier 13 deposition, other options may be available. For instance, a SAM selective to the metal structure 9 and suitable for use as a barrier 13 may be used. Another option may be to grow selectively a barrier 13 on the metal structure 9 by means of an electroless process. NiB and CoWP barriers may be grown that way. An advantage of these alternative options is that no SAM needs to be deposited on the etch block layer 3, which means that no SAM will need to be removed after the barrier 13 deposition. However, such barriers tend to be thicker than ALD or CVD deposited barriers.

FIG. 9 illustrates the device after coating (and surrounding) the at least one metal structure 9 with a $SiO_2$ or low-k dielectric layer 11. FIG. 10 illustrates the device after performance of a CMP until the top surface of the metal structure 9 is exposed.

A second example embodiment is depicted in FIGS. 11-20. Referring to FIG. 11, a device is provided that includes an oxide layer 5 having a thickness crossed by at least one metal element 4, an etch block layer 3 overlying the oxide layer 5 and the metal element 4, a sacrificial layer 2 overlying the etch block layer 3, a dielectric layer 1 overlying the sacrificial layer 2, and a patterned photoresist 6 overlying the dielectric layer 1. The patterned photoresist 6 includes at least one opening corresponding to at least one trench to be formed. That the opening corresponds to a trench means that the opening has lateral dimensions suitable for obtaining the desired trench. Typically, this means that the lateral dimensions of the opening are the same as those of the trench. The photoresist 6 may be patterned by using a photolithographic mask.

FIG. 12 illustrates the device after etching through the at least one opening of the dielectric layer 1 and the sacrificial layer 2. Trench holes are cut through both the dielectric layer 1 and the sacrificial layer 2, exposing a portion of the etch block layer 3. The photoresist may be removed during or after this step. FIG. 13 illustrates the device after the dielectric layer 1 and the etch block layer 3 have been etched. The trenches extend through the etch block layer 3 exposing the top surface of the metal element 4. FIG. 14 illustrates the device after a self-assembled monolayer (SAM) 10 is applied selectively on the exposed surface of the oxide layer 5.

FIG. 15 illustrates the device after a metal 9 (e.g., copper but alternative metals are possible) is grown on the SAM 10. The at least one trench is thereby filled forming at least one metal structure 9 (here metal lines). The metal structure 9 extends above the trench and covers the sacrificial layer 2. FIG. 16 illustrates the device after the metal structure 9 is planarized by CMP until all portions of the metal structure 9 on the top surface of the sacrificial layer 2 are removed, causing the top surface of the metal structure 9 and the top surface of the sacrificial layer 2 to be substantially co-planar. FIG. 17 illustrates the device after the sacrificial layer 2 is removed, thereby exposing the at least one metal structure 9.

FIG. 18 illustrates the device after the at least one metal structure 9 is selectively surrounded by a barrier 13 (Ta/TaN). To deposit the barrier 13, a hydrophobic SAM selective to the etch block layer may be deposited to inhibit deposition of the barrier 13. The barrier 13 may then be deposited by Atomic Layer Deposition (ALD) on the metal structure 9. FIG. 19 illustrates the device after coating (and surrounding) of the at least one metal structure 9 with a $SiO_2$ or low-k dielectric layer 11. FIG. 20 illustrates the device after performance of a CMP until the top surface of the metal structure 9 is exposed.

A third example embodiment is depicted in FIGS. 1-6 and 21-33. This third example embodiment follows the first example embodiment up to and including FIG. 6. FIG. 21 illustrates the device after a portion of the sacrificial layer 2 is etched until a top portion of each of the at least one metal structure 9 extends above the sacrificial layer 2. FIG. 22 illustrates the device after the remaining portion of the sacrificial layer 2 and the exposed top portion of the at least one metal structure 9 is overlaid with a conformal dielectric layer 8 ($SiO_2$) deposited by ALD. FIG. 23 illustrates the device after a second sacrificial layer (2') (e.g. an organic layer such as a spin-on carbon or an APF layer) is overlaid (e.g., by spin coating) on the conformal dielectric layer 8, a dielectric layer 1 (e.g., a spin-on glass or a SiOC layer) is overlaid (e.g., by spin coating) on the second sacrificial layer 2', and a second dielectric layer 1 is overlaid with a patterned photoresist 6 including at least one opening corresponding to at least one trench to be formed.

FIG. 24 illustrates the device after the dielectric layer 1 and the second sacrificial layer 2' are etched through the at least one opening so as to expose the conformal dielectric layer 8 covering the at least one metal structure 9. The etching is stopped when the conformal dielectric layer 8 covering the metal structure 9 is reached. This leaves a portion of the second sacrificial layer 2' unetched between the vias within the trenches. FIG. 25 illustrates the device after the dielectric layer 1 and the exposed conformal dielectric layer 8 covering the at least one metal structure 9 are removed (this may be performed via a short oxide breakthrough using a diluted HF aqueous solution or via dry etching). FIG. 26 illustrates the device after the second sacrificial layer 2' is etched until the conformal dielectric layer 8 is exposed in the at least one trench.

FIG. 27 illustrates the device after a self-assembled monolayer 10 is selectively applied on the exposed conformal dielectric layer 8. FIG. 28 illustrates the device after a metal 9 is grown on the self-assembled monolayer 10 and on the exposed top surface of the at least one metal structure 9, filling the at least one trench and covering the top surface of the second sacrificial layer 2'. FIG. 29 illustrates the device after chemical mechanical planarization is performed until substantially all metal 9 on the top surface of the second sacrificial layer 2' is removed. FIG. 30 illustrates the device after the first and second sacrificial layers 2, 2' as well as the conformal dielectric layer 8 are removed, thereby exposing the at least one metal structure 9. FIG. 31 illustrates the device after the at least one metal structure 9 is surrounded by a barrier 13 (Ta/TaN). To deposit the barrier 13, a hydrophobic SAM selective to the etch block layer 3 may be deposited to inhibit deposition of the barrier 13. The barrier 13 may then be deposited by Atomic Layer Deposition (ALD) on the metal structure 9. FIG. 32 illustrates the device after coating (and surrounding) the at least one metal structure 9 with a SiO$_2$ or low-k dielectric layer 11. FIG. 33 illustrates the device after performance of a CMP until the top surface of the metal structure 9 is exposed.

A fourth example embodiment is depicted in FIGS. 34-53. Referring to FIG. 34, a device is illustrated which comprises an oxide layer 5 having a thickness crossed by at least one metal element 4, an etch block layer 3 overlying the oxide layer 5 and the metal element 4, a sacrificial layer 2 overlying the etch block layer 3, a dielectric layer 1 overlying the sacrificial layer 2, a second sacrificial layer 2' overlying the dielectric layer 1, a second dielectric layer 1' overlying the second sacrificial layer 2', and a patterned photoresist 6 overlying the dielectric layer 1. The patterned photoresist 6 includes at least one opening corresponding to at least one via to be formed. The photoresist 6 may be patterned by using a photolithographic mask.

FIG. 35 illustrates the device after etching, through the at least one opening, of the second dielectric layer 1', the second sacrificial layer 2', the first dielectric layer 1 and the first sacrificial layer 2. The device includes via holes cut through the second dielectric layer 1', the second sacrificial layer 2', the first dielectric layer 1, and the first sacrificial layer 2. A portion of the etch block layer 3 is thereby exposed. The photoresist 6 is removed during or after this step. FIG. 36 illustrates the device after the dielectric layer 1 and the etch block layer 3 are etched simultaneously and the side walls are passivated with a hydrophilic polymer 14. The via extends through the etch block layer 3, and the top surface of the metal element 4 is exposed. The hydrophilic side walls permit the easy removal of the dielectric material 7.

FIG. 37 illustrates the device after the at least one via is filled with a dielectric material 7 so that the top surface of the second sacrificial layer 2' is covered with the dielectric material 7. FIG. 38 illustrates the device after the dielectric material 7 is etched until the top surface of the dielectric material 7 and the top surface of the second sacrificial layer 2' are substantially coplanar. This etching may be performed with HF. Both vapour HF and aqueous HF can be used. FIG. 39 illustrates the device after the first step of the trench patterning. For introducing trenches in the structure, the dielectric material 7 and the second sacrificial layer 2' are overlaid with a hard mask 12 (e.g., AN), the hard mask 12 is overlaid with a third sacrificial layer 2'', and the third sacrificial layer 2'' is overlaid with a second dielectric layer 1'. FIG. 40 illustrates the device after one or more trenches are etched through the dielectric layer 1' and the third sacrificial layer 2'' so that at least one of the trenches is aligned with the at least one via.

FIG. 41 illustrates the device after the hard mask 12 is etched. FIG. 42 illustrates the device after the dielectric material 7 is removed, thereby exposing the surface of the metal element 4. FIG. 43 illustrates the device after a self-assembled monolayer (SAM) 10 is applied selectively on the exposed surface of the metal element 4. FIG. 44 illustrates the device after a metal 9 is grown to fill the at least one via only up to below the dielectric layer 1, the hydrophilic polymer 14 is removed, and the second sacrificial layer 2' is removed from within the trenches so as to expose the dielectric layer 1. FIG. 45 illustrates the device after the second dielectric layer 1' is removed.

FIG. 46 illustrates the device after a second self-assembled monolayer 10' is applied selectively on the dielectric layer 1. FIG. 47 illustrates the device after a second metal 9' is grown on the second self-assembled monolayer 10' and on the metal 9 so as to complete the filling of the at least one via and so as to fill the at least one trench and cover the second sacrificial layer 2'. FIG. 48 illustrates the device after chemical mechanical planarization is performed until substantially all metal 9 present on the second sacrificial layer 2' top surface is removed. FIG. 49 illustrates the device after the first and second sacrificial layers 2, 2' as well as the hard mask 12 are removed, thereby exposing the metal 9.

FIG. 50 illustrates the device after the metal 9 and second metal 9' are surrounded by a barrier 13 (e.g., Ta/TaN). To deposit the barrier 13, a hydrophobic SAM selective to the etch block layer 3 may be deposited to inhibit deposition of the barrier 13. The barrier 13 may then be deposited by Atomic Layer Deposition (ALD) on the metal 9 and second metal 9'. FIG. 51 illustrates the device after coating (and surrounding) of the metal 9 and second metal 9' with a SiO$_2$ or low-k dielectric layer 11. FIG. 52 illustrates the device after performance of a CMP until the top surface of the second metal 9' is exposed.

A fifth example embodiment is depicted in FIGS. 1-3 and 53-71. The fifth example embodiment follows the first example embodiment up to and including FIG. 3. FIG. 53 illustrates the device after the at least one via is filled with a dielectric material 7 until the top surface of the sacrificial layer 2 is covered with the dielectric material 7. FIG. 54 illustrates the device after the dielectric material 7 is etched until the top surface of the dielectric material 7 and the top surface of the sacrificial layer 2 are substantially coplanar, forming at least one dielectric pillar 7. This etching may be performed with HF. Both vapour HF and aqueous HF can be used.

FIG. 56 illustrates the device after part of the sacrificial layer 2 is etched until a top portion of the at least one dielectric pillar 7 stands out of the sacrificial layer 2. FIG. 57 illustrates the device after what remains from the sacrificial layer 2 and the top portion of the at least one dielectric pillar 7 are overlaid with a conformal dielectric layer 8. FIG. 58 illustrates the device after a second sacrificial layer 2' is overlaid on the conformal dielectric layer 8, a dielectric layer 1 is overlaid on the second sacrificial layer 2', and a patterned photoresist 6 is overlaid on the dielectric layer 1. The patterned photoresist 6 includes at least one opening corresponding to at least one trench to be formed.

FIG. 59 illustrates the device after the dielectric layer 1 and the second sacrificial layer 2' are etched through the at least one opening so as to expose the conformal dielectric layer 8 covering the at least one dielectric pillar 7. The etching may be stopped when the conformal dielectric layer 8 covering the dielectric pillar 7 is reached. This leaves some of the second sacrificial layer 2' unetched between the vias within the trenches. FIG. 60 illustrates the device after the dielectric layer 1 and the exposed conformal dielectric layer 8 covering the at least one dielectric pillar 7 are removed (this can be performed via a short oxide breakthrough using a diluted HF aqueous solution or via dry etching). FIG. 61 illustrates the device after the dielectric material 7 is removed, thereby exposing the surface of the metal element 4. FIG. 62 illustrates the device after a self-assembled monolayer (SAM) 10 is applied selectively on the exposed surface of the metal element 4.

FIG. 63 illustrates the device after a metal is grown to fill the at least one via only up to below the conformal dielectric layer 8, forming at least one metal pillar 9. FIG. 64 illustrates the device after the second sacrificial layer 2' is etched until the conformal dielectric layer 8 is exposed in the at least one trench. FIG. 65 illustrates the device after a second self-assembled monolayer 10' is selectively applied on the exposed conformal dielectric layer 8. FIG. 66 illustrates the device after a metal is grown on the second self-assembled monolayer 10' and on the exposed top surface of the at least one metal pillar 9, so as to fill the at least one trench and to cover the second sacrificial layer 2' top surface, forming a metal structure 9'. FIG. 67 illustrates the device after chemical mechanical planarization is performed until substantially all of the metal structure 9' present on the second sacrificial layer 2' top surface has been removed. FIG. 68 illustrates the device after the first and second sacrificial layers 2, 2' as well as the conformal dielectric layer 8 are removed, thereby exposing the metal structure 9'.

FIG. 69 illustrates the device after that the metal structure 9' is surrounded by a barrier 13 (e.g., Ta/TaN). To deposit the barrier 13, a hydrophobic SAM selective to the etch block layer 3 may be deposited to inhibit deposition of the barrier 13. The barrier 13 may then be deposited by Atomic Layer Deposition (ALD) on the metal structure 9'. FIG. 70 illustrates the device after coating (and surrounding) the metal structure 9' with a SiO$_2$ or low-k dielectric layer 11. FIG. 71 illustrates the device after performance of a CMP until the top surface of the metal structure 9' is exposed.

A sixth example embodiment is depicted in FIGS. 72-87. Referring to FIG. 72, a device is provided which includes an oxide layer 5 having a thickness crossed by at least one metal element 4, an etch block layer 3 overlying the oxide layer 5 and the metal element 4, a sacrificial layer 2 overlying the etch block layer 3, a dielectric layer 1 overlying the sacrificial layer 2, a second sacrificial layer 2' overlying the dielectric layer 1, a second dielectric layer 1' overlying the second sacrificial layer 2', a metal hard mask 12 overlying the second dielectric 1', and a patterned photoresist 6 overlying the metal hard mask 12. The patterned photoresist 6 includes at least one opening corresponding to at least one trench to be formed. The photoresist 6 may be patterned by using a photolithographic mask.

FIG. 73 illustrates the device after the metal hard mask 12 is etched through the trench opening and the patterned photoresist is removed. Part of the second dielectric layer 1' is thereby exposed. FIG. 74 illustrates the device after the metal hard mask 12 and the exposed parts of the second dielectric layer 1' are overlaid with another patterned photoresist 6' including at least one opening corresponding to at least one via to be formed directly above the at least one trench. FIG. 75 illustrates the device after the second dielectric layer 1' and the second sacrificial layer 2' are etched through the at least one via opening and the other patterned photoresist 6' is removed, thereby exposing part of the etch block layer 3.

FIG. 76 illustrates the device after the exposed etch block layer 3 and the second dielectric layer 1' are etched through the metal hard mask 12 so as to expose the top surface of the metal element 4. The etching is stopped before reaching the first dielectric layer 1. FIG. 77 illustrates the device after the hard mask 12 and the second dielectric layer 1' are removed. FIG. 78 illustrates the device after a self-assembled monolayer (SAM) 10 is applied selectively on the exposed surface of the metal element 4. FIG. 79 illustrates the device after a metal is grown to fill the at least one via only up to below the first dielectric layer 1, forming at least one metal pillar 9.

FIG. 80 illustrates the device after the second sacrificial layer 2' is etched until the first dielectric layer 1 is exposed in the at least one trench. FIG. 81 illustrates the device after a second self-assembled monolayer 10' is selectively applied on the exposed first dielectric layer 1. FIG. 82 illustrates the device after a metal is grown on the second self-assembled monolayer 10' and on the exposed top surface of the at least one metal pillar 9, so as to fill the at least one trench and to cover the second sacrificial layer 2' top surface, forming a metal structure 9'. FIG. 83 illustrates the device after chemical mechanical planarization is performed until substantially all of the metal structure 9' present on the second sacrificial layer 2' top surface has been removed.

Figure 85:
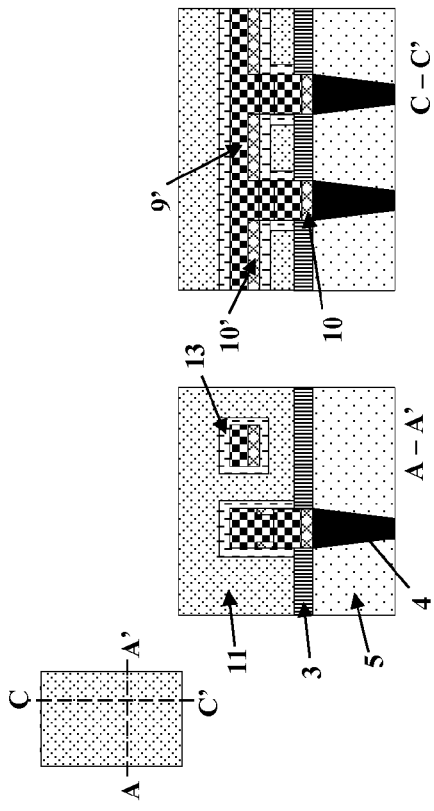
Figure 86:
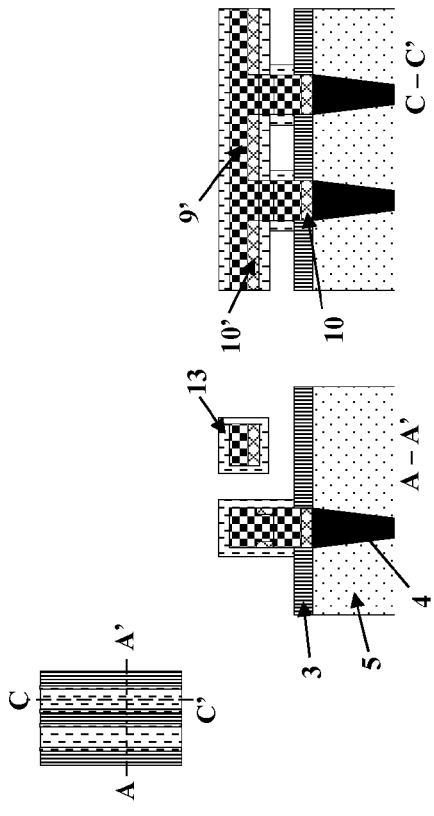
Figure 87:
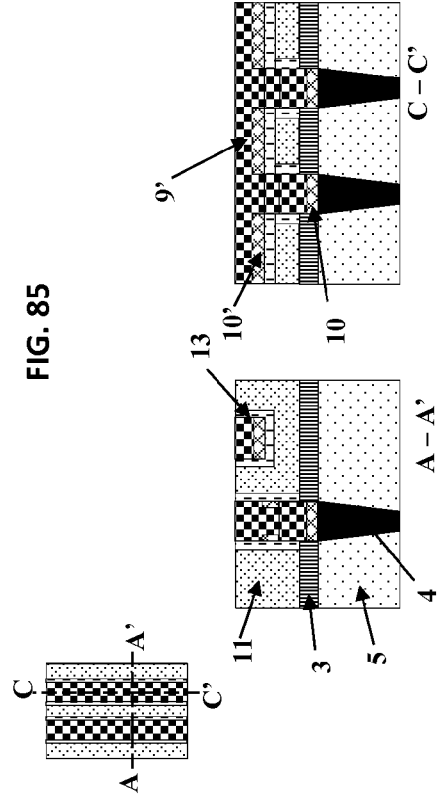

FIG. 84 illustrates the device after the first and second sacrificial layers 2, 2' as well as the conformal dielectric layer 8 are removed, thereby exposing the metal structure 9'. FIG. 85 illustrates the device after the metal structure 9' element is surrounded by a barrier 13 (e.g., Ta/TaN). To deposit the barrier 13, a hydrophobic SAM selective to the etch block layer 3 may be deposited to inhibit deposition of the barrier 13. The barrier 13 may then be deposited by Atomic Layer Deposition (ALD) on the metal structure 9'. FIG. 86 illustrates the device after coating (and surrounding) the metal structure 9' with a SiO$_2$ or low-k dielectric layer 11. FIG. 87 illustrates the device after performance of a CMP until the top surface of the metal structure 9' is exposed.

It is to be understood that although preferred embodiments, specific constructions and configurations, as well as materials, have been discussed herein for devices according to the present disclosure, various changes or modifications in form and detail may be made without departing from the scope and spirit of this disclosure. For example, any formulas given above are merely representative of procedures that may be used. Functionality may be added or deleted from the block diagrams and operations may be interchanged among functional blocks. Steps may be added or deleted to methods described within the scope of the present disclosure.

What is claimed is:

1. A method for fabricating a semiconductor device, comprising:
   providing a device with a first sacrificial layer, wherein the first sacrificial layer includes at least one via exposing a metal surface;
   applying a self-assembled monolayer on the exposed metal surface;
   growing a metal on the self-assembled monolayer to fill the at least one via, thereby forming at least one metal pillar; and replacing the first sacrificial layer with a replacement dielectric layer having a dielectric constant of at most 3.9.

2. The method of claim 1, wherein the device further comprises a first dielectric layer overlying the first sacrificial layer and a second sacrificial layer overlying the first dielectric layer, the method further comprising, before applying the self-assembled monolayer:
covering side walls of the at least one via with a passivation layer;
filling the at least one via with a dielectric material so that a top surface of the dielectric material and a top surface of the second sacrificial layer are substantially coplanar;
overlaying the dielectric material and the second sacrificial layer with a hard mask;
overlaying the hard mask with a third sacrificial layer;
overlaying the third sacrificial layer with a second dielectric layer;
etching one or more trenches through the second dielectric layer, the third sacrificial layer, and the hard mask so that at least one of the trenches is aligned with at least one via, thereby exposing the dielectric material and part of the second sacrificial layer; and
removing the dielectric material, thereby exposing the metal surface.

3. The method of claim 2, wherein the metal grown on the self-assembled monolayer fills the at least one via only up to below the first dielectric layer, and wherein the method further comprises, after growing the metal on the self-assembled monolayer and before replacing the first sacrificial layer with the replacement dielectric layer:
removing the exposed passivation layer and removing the second sacrificial layer from within the trenches to expose part of the first dielectric layer;
removing the second dielectric layer;
applying a self-assembled monolayer on the first dielectric layer; and
growing a metal on the self-assembled monolayer and on the exposed metal surface to completely fill the at least one via and to fill the at least one trench.

4. The method of claim 1, further comprising, before applying the self-assembled monolayer:
filling the at least one via with a dielectric material so that a top surface of the dielectric material and a top surface of the first sacrificial layer are substantially coplanar, thereby forming at least one dielectric pillar;
etching part of the first sacrificial layer until a top portion of the at least one dielectric pillar stands out of the first sacrificial layer;
overlaying what remains from the first sacrificial layer and the top portion of the at least one dielectric pillar with a conformal dielectric layer;
providing a second sacrificial layer on the conformal dielectric layer;
providing a second dielectric layer on the second sacrificial layer;
forming at least one trench in the second dielectric layer, the second sacrificial layer, and the conformal dielectric layer, exposing the top surface of the at least one dielectric pillar; and
removing the dielectric pillar, thereby exposing the metal surface.

5. The method of claim 1, wherein the device further comprises a first dielectric layer and a second sacrificial layer, wherein the at least one via cuts through the first dielectric layer and the first and second sacrificial layers, wherein the second sacrificial layer comprises at least one trench aligned with the at least one via, wherein growing the metal on the self-assembled monolayer comprises growing the metal on the self-assembled monolayer to fill the at least one via only up to below the first dielectric layer, and wherein the method further comprises, after growing the metal on the self-assembled monolayer and before replacing the first sacrificial layer with the replacement dielectric layer:
removing the second sacrificial layer from within the at least one trench, exposing part of the first dielectric layer;
applying a self-assembled monolayer on the exposed first dielectric layer; and
growing a metal on the self-assembled monolayer and on the exposed metal surface to completely fill the at least one via and to fill the at least one trench.

6. The method of claim 4, wherein growing the metal on the self-assembled monolayer comprises growing the metal on the self-assembled monolayer to fill the at least one via only up to below the conformal dielectric layer, and wherein the method further comprises, after growing the metal on the self-assembled monolayer and before replacing the first sacrificial layer with the replacement dielectric layer:
removing the second sacrificial layer from within the at least one trench, exposing the underlying conformal dielectric layer;
applying a second self-assembled monolayer on the exposed conformal dielectric layer; and
growing a metal layer on the second self-assembled monolayer and on the exposed metal surface to fill the at least one trench.

7. The method of claim 1, wherein growing the metal on the self-assembled monolayer comprises:
growing the metal on the self-assembled monolayer to fill the at least one via and to cover the first sacrificial layer top surface; and
performing chemical mechanical planarization until substantially all metal present on the first sacrificial layer top surface has been removed.

8. The method of claim 1, further comprising, after growing the metal on the self-assembled monolayer and before replacing the first sacrificial layer with the replacement dielectric layer:
etching part of the first sacrificial layer until a top portion of the at least one metal pillar stands out of the first sacrificial layer;
overlaying what remains of the first sacrificial layer and the top portion of the at least one metal pillar with a conformal dielectric layer;
providing a second sacrificial layer on the conformal dielectric layer;
forming at least one trench in the second sacrificial layer, exposing a top surface of the at least one metal pillar and a portion of the conformal dielectric layer;
applying a second self-assembled monolayer on the exposed conformal dielectric layer; and
growing a metal on the second self-assembled monolayer and on the exposed top surface of the at least one metal pillar to fill the at least one trench.

9. The method of claim 8, wherein forming at least one trench in the second sacrificial layer comprises:
overlaying the second sacrificial layer with a dielectric layer;
overlaying the dielectric layer with a patterned photoresist comprising at least one opening corresponding to at least one trench to be formed;

etching the dielectric layer and the second sacrificial layer through the at least one opening to expose the conformal dielectric layer covering the at least one metal pillar;

removing the dielectric layer and the exposed conformal dielectric layer covering the at least one metal pillar; and etching the second sacrificial layer until the conformal dielectric layer is exposed in the at least one trench.

10. The method of claim 8, wherein growing the metal on the second self-assembled monolayer and on the exposed top surface of the at least one metal pillar comprises:

growing a metal on the second self-assembled monolayer and on the exposed top surface of the at least one metal pillar to fill the at least one trench and to cover the second sacrificial layer top surface; and performing a chemical mechanical planarization until substantially all metal present on the second sacrificial layer top surface has been removed.

11. The method of claim 5, wherein providing a device with a first sacrificial layer comprises:

providing a first oxide layer having a thickness crossed by at least one metal element;

overlaying the first oxide layer with an etch block layer;

overlying the etch block layer with the first sacrificial layer;

overlaying the first sacrificial layer with a first dielectric layer;

overlaying the first dielectric layer with a second sacrificial layer;

overlaying the second sacrificial layer with a second dielectric layer;

overlaying the second sacrificial layer with a hard mask;

overlaying the hard mask with the patterned photoresist comprising at least one trench opening corresponding to at least one trench to be formed;

etching the hard mask through the trench opening to expose part of the second dielectric layer;

removing the patterned photoresist;

overlaying the hard mask and the exposed parts of the second dielectric layer with a second patterned photoresist comprising at least one via opening corresponding to at least one via to be formed directly above the at least one trench;

etching the second dielectric layer, the second sacrificial layer, the first dielectric layer, and the first sacrificial layer through the at least one via opening to expose part of the etch block layer;

removing the second patterned photoresist;

etching the exposed etch block layer and the second dielectric layer through the hard mask to expose the top metal surface of the metal element, wherein the etching is stopped before reaching the first dielectric layer; and removing the hard mask and the second dielectric layer.

12. The method of claim 6, wherein replacing the first sacrificial layer with the replacement dielectric layer comprises:

removing the first and second sacrificial layers, the conformal dielectric layer, and the first dielectric layer, thereby exposing the metal layer;

covering the metal layer with a replacement dielectric layer having a dielectric constant of at most 3.9; and performing a chemical mechanical planarization of the replacement dielectric layer until the top surface of the metal layer is exposed.

13. The method of claim 12, wherein the metal structure is a copper structure, and wherein, before covering the metal layer with the replacement dielectric layer, the exposed metal structure is coated with a barrier layer.

14. A method for fabricating a semiconductor device, comprising:

providing a device with a first sacrificial layer, wherein the first sacrificial layer includes at least one through-hole exposing a metal surface and an oxide surface;

applying a self-assembled monolayer on the exposed oxide surface;

growing a metal on the self-assembled monolayer and on the exposed metal surface to fill the at least one through-hole, thereby forming at least one metal structure; and replacing the first sacrificial layer by a replacement dielectric layer having a dielectric constant of at most 3.9.

15. The method of claim 14, wherein providing a device with a first sacrificial layer comprises:

providing an oxide layer having a thickness crossed by at least one metal element;

overlaying the oxide layer with an etch block layer;

overlaying the etch block layer with the first sacrificial layer;

overlaying the first sacrificial layer with a first dielectric layer;

providing a patterned photoresist on top of the first dielectric layer, comprising at least one opening corresponding to the at least one through-hole to be formed;

etching the first dielectric layer and the first sacrificial layer to form the at least one through-hole, thereby exposing a portion of the etch block layer;

removing the photoresist; and removing the first dielectric layer and etching the exposed portion of the etch block layer to expose the top metal surface of the metal element.

* * * * *